(12) United States Patent
Said et al.

(10) Patent No.: US 11,171,097 B2
(45) Date of Patent: Nov. 9, 2021

(54) BONDED ASSEMBLY CONTAINING METAL-ORGANIC FRAMEWORK BONDING DIELECTRIC AND METHODS OF FORMING THE SAME

(71) Applicant: SANDISK TECHNOLOGIES LLC, Addison, TX (US)

(72) Inventors: Ramy Nashed Bassely Said, San Jose, CA (US); Raghuveer S. Makala, Campbell, CA (US); Senaka Kanakamedala, San Jose, CA (US); Fei Zhou, San Jose, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/774,446

(22) Filed: Jan. 28, 2020

(65) Prior Publication Data
US 2021/0233881 A1     Jul. 29, 2021

(51) Int. Cl.
*H01L 23/00*     (2006.01)

(52) U.S. Cl.
CPC .............. *H01L 24/08* (2013.01); *H01L 24/83* (2013.01); *H01L 2224/05647* (2013.01); *H01L 2224/08145* (2013.01)

(58) Field of Classification Search
CPC ........... H01L 24/04; H01L 2224/27452; H01L 2224/27526; H01L 27/11524; H01L 24/08; H01L 24/83; H01L 2224/08145
USPC ........................................................ 438/612
See application file for complete search history.

(56) References Cited

U.S. PATENT DOCUMENTS

| | | |
|---|---|---|
| 5,915,167 A | 6/1999 | Leedy |
| 10,115,681 B1 | 10/2018 | Ariyoshi |
| 10,283,493 B1 | 5/2019 | Nishida |
| 10,354,980 B1 | 7/2019 | Mushiga et al. |
| 10,354,987 B1 | 7/2019 | Mushiga et al. |
| 10,381,322 B1 | 8/2019 | Azuma et al. |
| 10,381,362 B1 | 8/2019 | Cui et al. |
| 10,510,738 B2 | 12/2019 | Kim et al. |
| 2014/0353828 A1* | 12/2014 | Edelstein ............ H01L 23/5329 257/751 |

(Continued)

OTHER PUBLICATIONS

Stassin, T. et al., "Vapour-Phase Deposition of Oriented Copper Dicarboxylate Metal-Organic Framework Thin Films," *Chemical Communications* 55.68 (2019): 10056-10059.

(Continued)

*Primary Examiner* — Didarul A Mazumder
(74) *Attorney, Agent, or Firm* — The Marbury Law Group PLLC

(57) ABSTRACT

A bonded assembly includes a first semiconductor die containing a first substrate, first semiconductor devices, and first bonding pads that are electrically connected to a respective node of the first semiconductor devices, a second semiconductor die containing a second substrate, second semiconductor devices, and second bonding pads that are electrically connected to a respective node of the second semiconductor devices and bonded to a respective one of the first bonding pads, and at least one metal-organic framework (MOF) dielectric layer that laterally surrounds at least one of the first bonding pads and the second bonding pads.

18 Claims, 25 Drawing Sheets

(56) References Cited

U.S. PATENT DOCUMENTS

| | | | |
|---|---|---|---|
| 2016/0079164 A1* | 3/2016 | Fukuzumi | H01L 27/11582 257/324 |
| 2018/0286846 A1* | 10/2018 | Lin | H01L 21/76897 |
| 2019/0221557 A1 | 7/2019 | Kim et al. | |
| 2019/0252361 A1 | 8/2019 | Nishida | |

OTHER PUBLICATIONS

Krishtab, M. et al., "Vapor-Deposited Zeolitic Imidazolate Frameworks as Gap-Filling Ultra-Low-k Dielectrics," Nature Communications, pp. 1-9, (2019) 10:3729 | https://doi.org/10.1038/s41467-019-11703-x | www.nature.com/naturecommunications.

Perez, E. V. et al., "Origins and Evolution of Inorganic-Based and MOF-Based Mixed-Matrix Membranes for Gas Separations," Processes 2016, vol. 4, No. 32, pp. 1-68; (2016) doi:10.3390/pr4030032, www.mdpi.com/journal/processes.

Ryder, M.0R., et al. "Understanding and controlling the dielectric response of metal—organic frameworks," *ChemPlusChem*, vol. 83.4, pp. 308-316, (2018).

Liu, C. et al., "Fluxless Soldering of Copper Substrates Using Self-Assembled Monolayers for Preservation," *IEEE Trans on Comp. & Packaging Tech.*, vol. 29, No. 3, pp. 512-521 (2006).

Hendon, C.H., et al. "Engineering the optical response of the titanium-MIL-125 metal—organic framework through ligand functionalization." *Journal of the American Chemical Society* 135. 30 (2013): 10942-10945.

Kramer, M. et al., "Synthesis and properties of the metal-organic framework Mo 3 (BTC) 2 (TUDMOF-1)," *Journal of Materials Chemistry*, vol. 16, No. 23 (2006): pp. 2245-2248.

Park, S.J. et al., "A mechanistic study of SF6/O2 reactive ion etching of molybdenum," Citation: Journal of Vacuum Science & Technology B: Microelectronics Processing and Phenomena, vol. 5, pp. 1372-1373, (1987); doi: 10.1116/1.583618 1372-1373.

U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/284,502, filed Feb. 25, 2019, SanDisk Technologies LLC.
U.S. Appl. No. 16/288,656, filed Feb. 19, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.
U.S. Appl. No. 16/694,400, filed Nov. 25, 2019, SanDisk Technologies LLC.
U.S. Appl. No. 16/694,438, filed Nov. 25, 2019, SanDisk Technologies LLC.
U.S. Appl. No. 16/722,745, filed Dec. 20, 2019, SanDisk Technologies LLC.
U.S. Appl. No. 16/722,824, filed Dec. 20, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/747,943, filed Jan. 21, 2020, SanDisk Technologies LLC.

Notification of Transmittal of the International Search Report and Written Opinion of the International Search Authority for International Patent Application No. PCT/US2020/035566, dated Oct. 4, 2020, 9 pages.

Gu, Z.G. et al., "Epitaxial Growth of MOF Thin Film for Modifying the Dielectric Layer in Organic Field-Effect Transistors," (Abstract) ACS Appl. Mater. Interfaces 2017, 9, 8, 7259-7264, Publication Date:Feb. 9, 2017, https://doi.org/10.1021/acsami.6b14541.

* cited by examiner

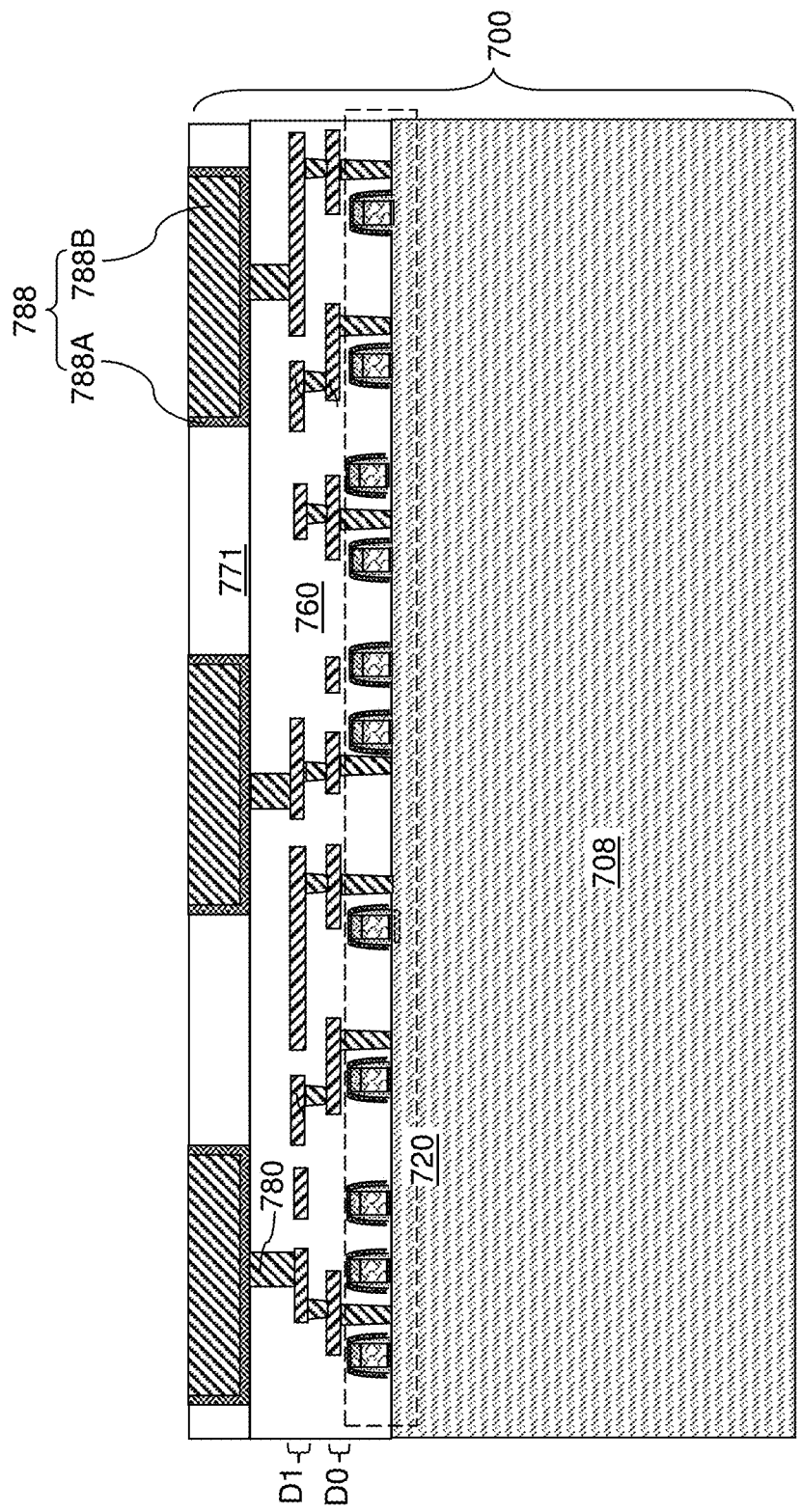

BONDED ASSEMBLY CONTAINING METAL-ORGANIC FRAMEWORK BONDING DIELECTRIC AND METHODS OF FORMING THE SAME

FIELD

The present disclosure relates generally to the field of semiconductor devices, and particularly to a bonded assembly of semiconductor devices containing metal-organic framework (MOF) bonding dielectric and methods for forming the same.

BACKGROUND

A semiconductor memory device may include a memory array and driver circuit located on the same substrate. However, the driver circuit takes up valuable space on the substrate, thus reducing the space available for the memory array.

SUMMARY

According to an aspect of the present disclosure, a bonded assembly comprises a first semiconductor die comprising a first substrate, first semiconductor devices, and first bonding pads that are electrically connected to a respective node of the first semiconductor devices; a second semiconductor die comprising a second substrate, second semiconductor devices, and second bonding pads that are electrically connected to a respective node of the second semiconductor devices and bonded to a respective one of the first bonding pads; and at least one metal-organic framework (MOF) dielectric layer that laterally surrounds at least one of the first bonding pads and the second bonding pads.

According to another aspect of the present disclosure, a method of forming a bonded assembly comprises providing a first semiconductor die comprising a first substrate, first semiconductor devices, and first bonding pads that are embedded in a first pad-level dielectric layer and electrically connected to a respective node of the first semiconductor devices; providing a second semiconductor die comprising a second substrate, second semiconductor devices, and second bonding pads that are embedded in a second pad-level dielectric layer, are electrically connected to a respective node of the second semiconductor devices, and are bonded to a respective one of the first bonding pads; vertically recessing the first pad-level dielectric layer relative to the first bonding pads to provide a first recessed dielectric surface; forming a first metal-containing precursor layer on the first recessed dielectric surface; forming a first metal-organic framework (MOF) dielectric layer that laterally surrounds the first bonding pads by reacting the first metal-containing precursor layer with a first vapor of a first linking compound; and bonding the first bonding pads to the second bonding pads prior to, or after, formation of the first MOF dielectric layer.

BRIEF DESCRIPTION OF THE DRAWINGS

FIG. 2A is a schematic vertical cross-sectional view of a second semiconductor die after formation of second bonding pads according to an embodiment of the present disclosure.

DETAILED DESCRIPTION

Figure 1A:
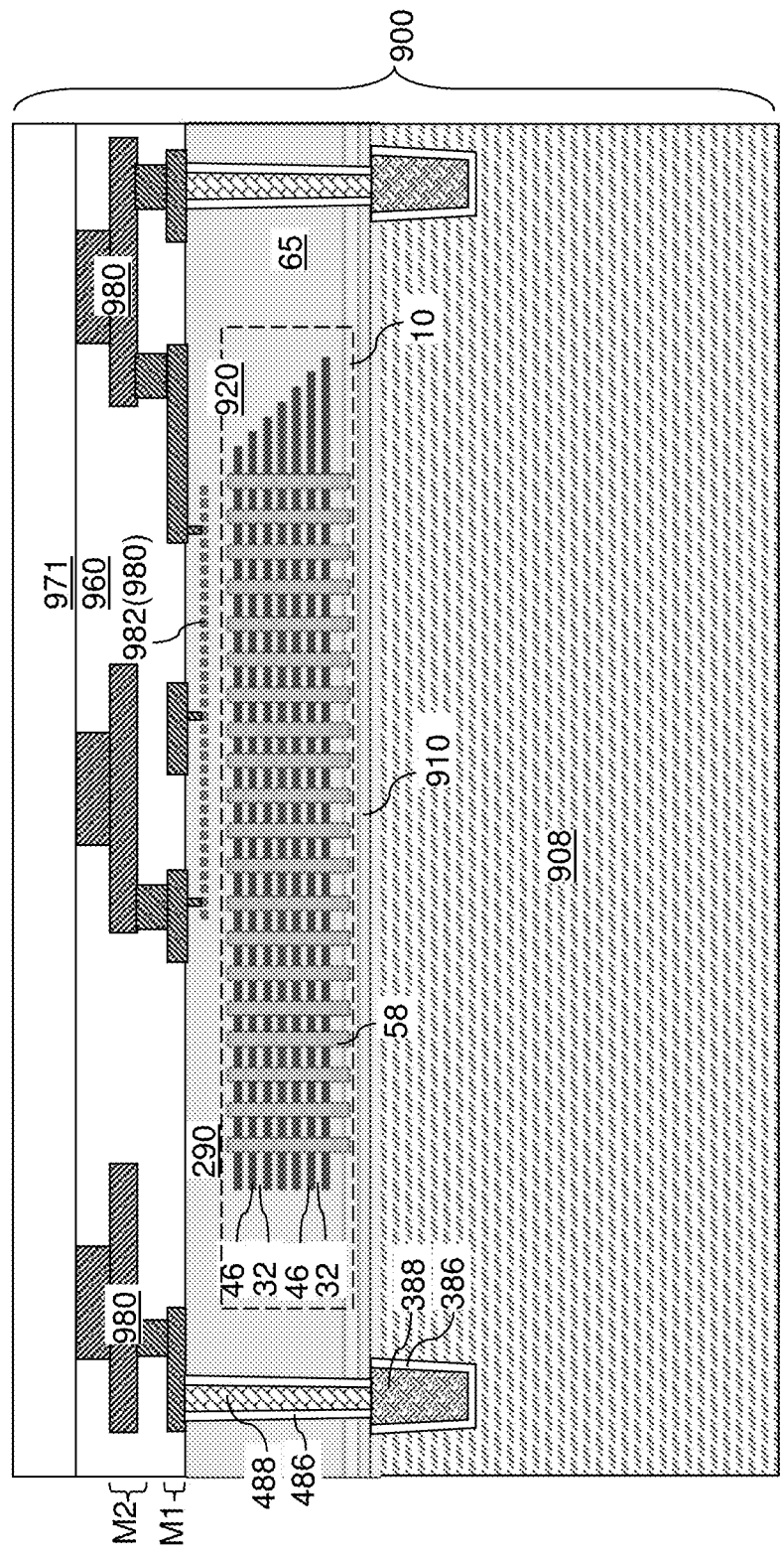
FIG. 1A is a schematic vertical cross-sectional view of a first semiconductor die after formation of a first pad-level dielectric layer according to an embodiment of the present disclosure.

A bonded assembly of a memory die and a logic die can be employed to provide a high performance three-dimensional memory device with improved memory array density and easier interconnection between the memory array located in the memory die and the driver circuit located in the logic die. An embodiment of the present disclosure is directed to a bonded assembly containing metal-organic framework (MOF) bonding dielectric and methods for forming the same, the various aspects of which are described in detail herebelow. The MOF bonding dielectric reduces the signal delay between the bonded semiconductor dies to provide a higher operation speed for the bonded assembly. Furthermore, the MOF bonding dielectric reduces or eliminates bonding pad metal diffusion into the bonding dielectric and formation of voids at the bonding interface.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1A, a first semiconductor die 900 according to an embodiment of the present disclosure is illustrated. The first semiconductor die 900 includes a first substrate 908, first semiconductor devices 920 overlying the first substrate 908, first dielectric material layers (290, 960, 971) overlying the first semiconductor devices, and first metal interconnect structures 980 embedded in the first dielectric material layers (290, 960, 971). In one embodiment, the first substrate 908 may be a commercially available silicon wafer having a thickness in a range from 500 microns to 1 mm.

Discrete substrate recess cavities can be formed in an upper portion of the first substrate 908 by applying a photoresist layer over the top surface of the first substrate 908, lithographically patterning the photoresist layer to form an array of discrete openings, and transferring the pattern of the array of discrete openings into the upper portion of the first substrate by performing an anisotropic etch process. The photoresist layer can be subsequently removed, for example, by ashing. The depth of each discrete substrate recess cavity can be in a range from 500 nm to 10,000 nm, although lesser and greater depths can also be employed. A through-substrate liner 386 and a through-substrate via structure 388 can be formed within each discrete substrate recess cavity.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

Through-memory-level via cavities can be formed through the dielectric material portions 65, the optional dielectric spacer layer 910, and the horizontal semiconductor channel layer 10. An optional through-memory-level dielectric liner 486 and a through-memory-level via structure 488 can be formed within each through-memory-level via cavity. Each through-memory-level dielectric liner 486 includes a dielectric material such as silicon oxide. Each through-memory-level via structure 488 can be formed directly on a respective one of the through-substrate via structure 388.

The first dielectric material layers (290, 960, 971) may include first contact-level dielectric layers 290 embedding contact via structures and bit lines 982, first interconnect-level dielectric layers 960 that embed a subset of the first metal interconnect structures 980 located above the first contact-level dielectric layers 290, and a first pad-level dielectric layer 971 that is formed above the first interconnect-level dielectric layer 960. The bit lines 982 are a subset of the first metal interconnect structures 980 and may electrically contact drain regions located above the semiconductor channel at the top of the memory opening fill structures 58. The contact via structures contact various nodes of the first semiconductor devices or the through-memory-level via structure 488. Interconnect metal lines and interconnect metal via structures, which are subsets of the first metal interconnect structures 980) may be embedded in the first interconnect-level dielectric layers 960. The first metal interconnect structures 980 can be located within the first interconnect-level dielectric layers 960. In an illustrative example, the first metal interconnect structures 980 may include a first memory-side metal level M0 including memory-side first-level metal lines, and a second memory-side metal level M1 including memory-side second-level metal lines.

Each of the first contact-level dielectric layers 290 and the first interconnect-level dielectric layers 960 may include a dielectric material such as undoped silicate glass, a doped silicate glass, organosilicate glass, silicon nitride, a dielectric metal oxide, or a combination thereof. A topmost layer of the first interconnect-level dielectric layers 960 may be a dielectric diffusion barrier layer (not expressly shown), which may be a silicon nitride layer having a thickness in a range from 10 nm to 300 nm.

The first pad-level dielectric layer 971 may include, and/or consist essentially of, undoped silicate glass, a doped silicate glass, organosilicate glass, silicon nitride, or a dielectric metal oxide. The thickness of the first pad-level dielectric layer 971 may be in a range from 100 nm to 3,000 nm, although lesser and greater thicknesses may also be employed. The first pad-level dielectric layer 971 may have a planar top surface, which may be provided, for example, by a planarization process such as a chemical mechanical polishing (CMP) process.

Figure 1B:
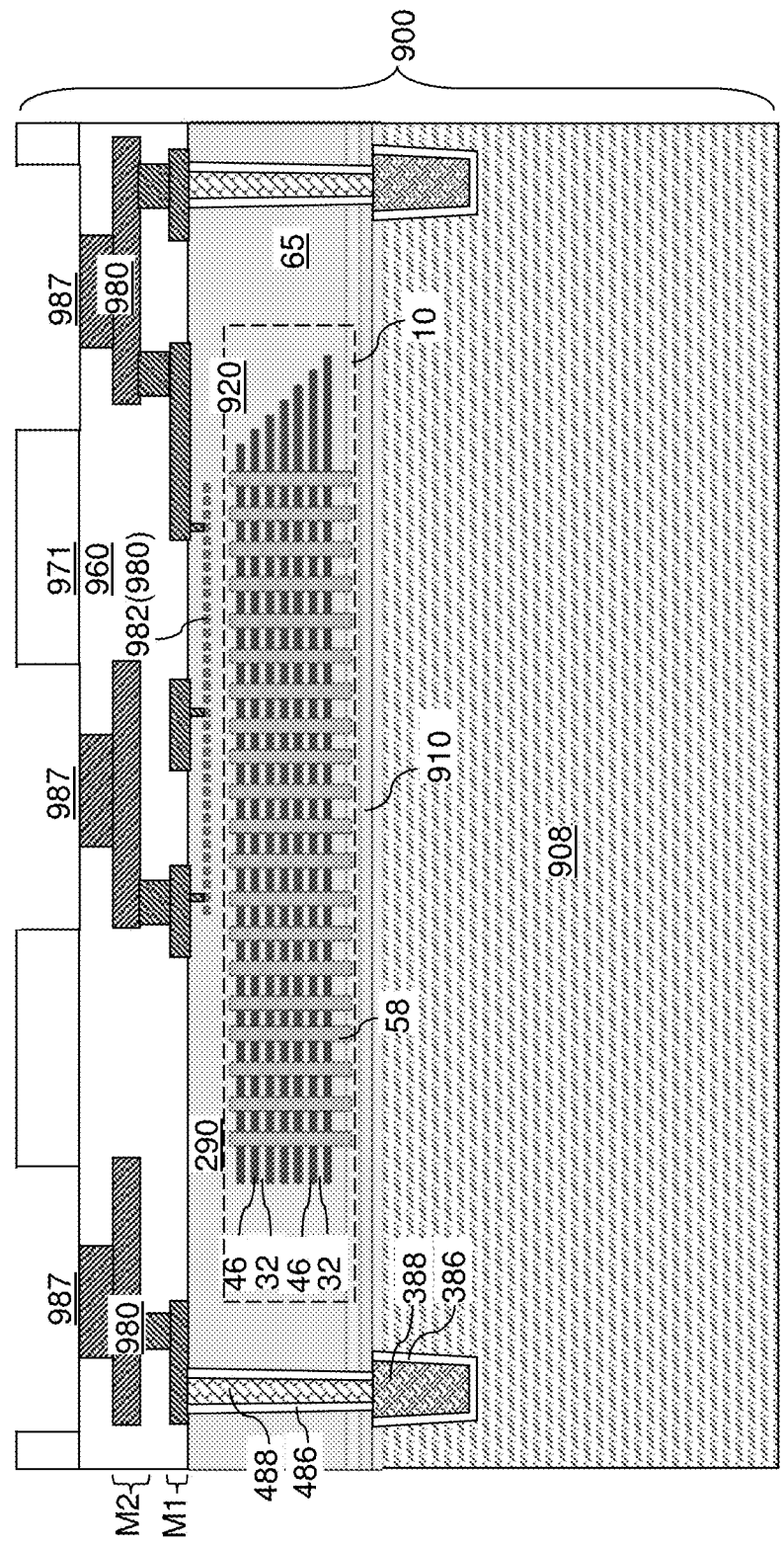
FIG. 1B is a schematic vertical cross-sectional view of the first semiconductor die after formation of first pad cavities according to an embodiment of the present disclosure.

Referring to FIG. 1B, a photoresist layer (not shown) can be applied over the first pad-level dielectric layer 971, and can be lithographically patterned to form discrete openings in areas that overlie topmost via structures of the first metal interconnect structures 980. An anisotropic etch process can be performed to transfer the pattern of the openings in the photoresist layer through the first pad-level dielectric layer 971. First pad cavities 987 are formed through the first pad-level dielectric layer 971. A top surface of a topmost via structure of the first interconnect structures 980 can be physically exposed at the bottom of each first pad cavity 987.

Figure 1C:
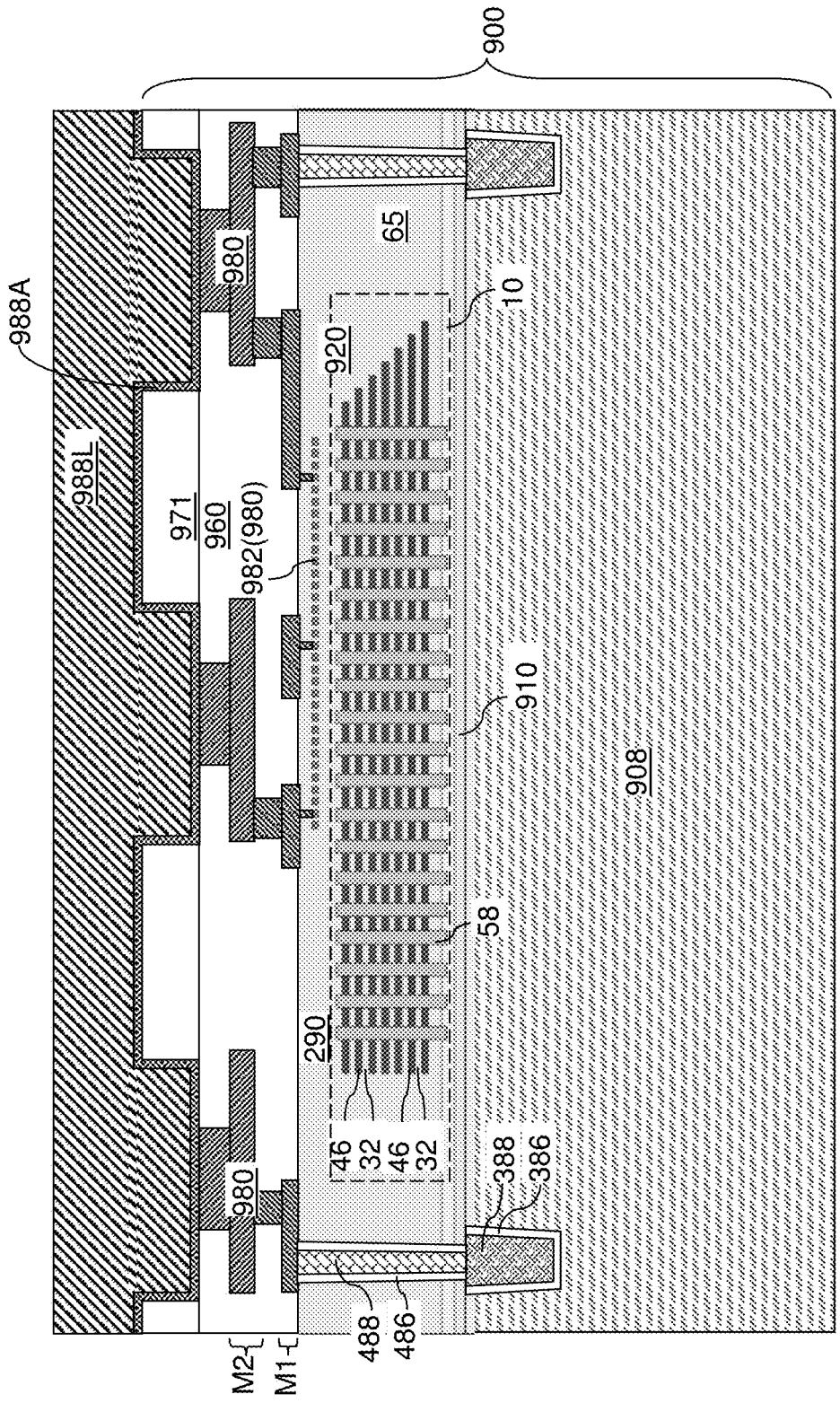
FIG. 1C is a schematic vertical cross-sectional view of the first semiconductor die after formation of a first metallic liner and a first metallic fill material layer according to an embodiment of the present disclosure.

Referring to FIG. 1C, a first metallic liner 988A and a first metallic fill material layer 988L can be deposited in the first pad cavities 987 and over the first pad-level dielectric layer 971. The first metallic liner 988A includes a metallic liner material such as TiN, TaN, WN, TiC, TaC, WC, or a stack thereof. The first metallic liner 988A can be deposited by physical vapor deposition or chemical vapor deposition. The thickness of horizontal portions of the first metallic liner 988A can be in a range from 5 nm to 50 nm, although lesser and greater thicknesses can also be employed. The first metallic fill material layer 988L includes a metallic material that can be bonded by metal-to-metal bonding. For example, the first metallic fill material layer 988L can include copper or a copper-containing alloy. The first metallic fill material layer 988L can be deposited, for example, by a sputtering, CVD, ALD, electroless plating and/or electroplating.

Figure 1D:
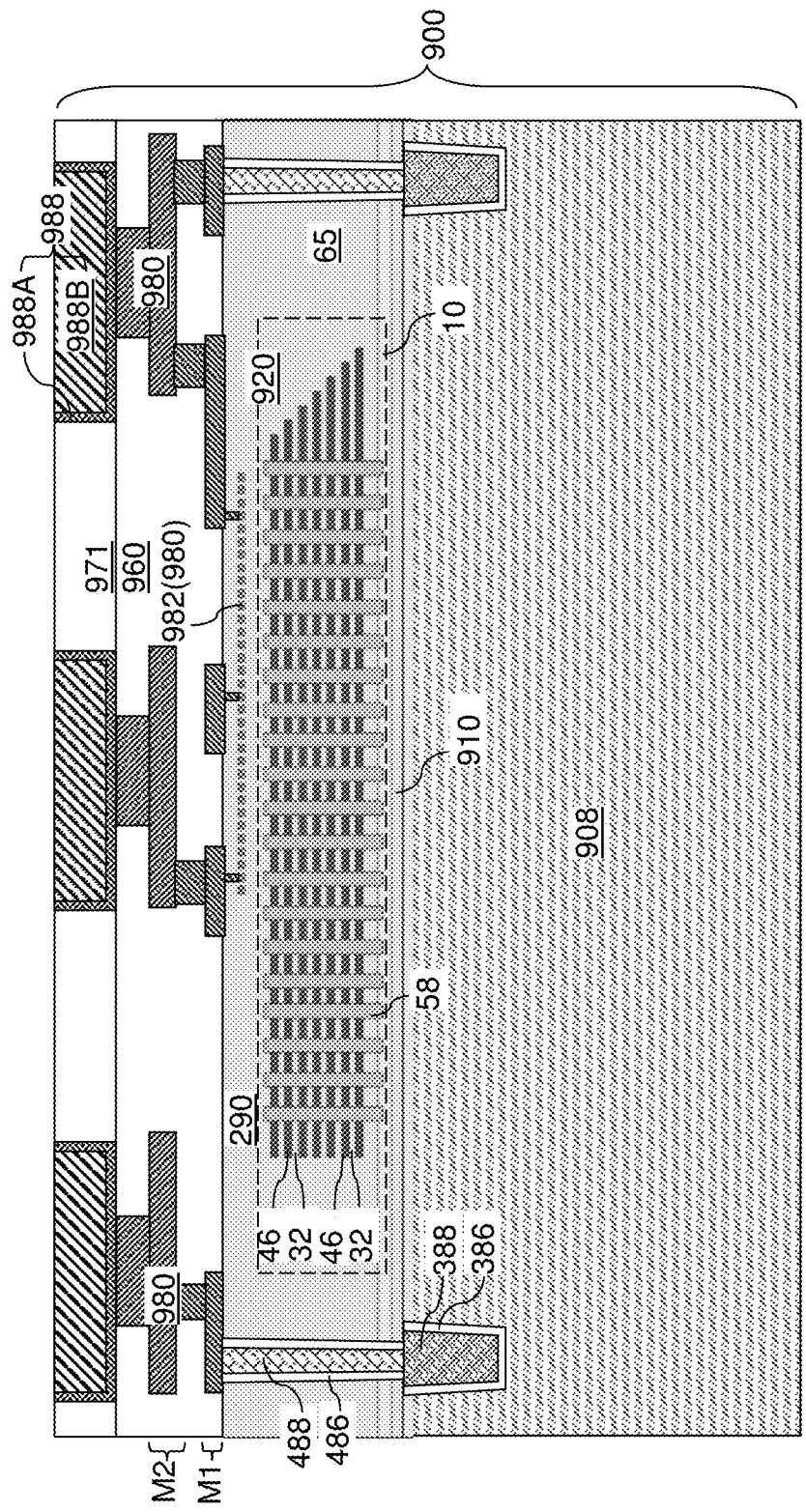
FIG. 1D is a schematic vertical cross-sectional view of the first semiconductor die after formation of first bonding pads according to an embodiment of the present disclosure.

Referring to FIG. 1D, a planarization process can be performed to remove horizontal portions of the first metallic fill material layer 988L and the first metallic liner 988A from above the horizontal plane including the top surface of the first pad-level dielectric layer 971. For example, a chemical mechanical planarization (CMP) process can be performed to remove excess portions of the first metallic fill material layer 988L and the first metallic liner 988A from above the horizontal plane including the top surface of the first pad-level dielectric layer 971. The first metallic liner 988A is divided into multiple portions located within a respective one of the first pad cavities 987. Each remaining portion of the first metallic fill material layer 988L located within a respective first pad cavity 987 constitutes a first metallic fill material portion 988B. Each contiguous set of the first metallic liner 988A and a first metallic fill material portion 988B constitutes a first bonding pad 988. Each first bonding pad 988 can have a horizontal cross-sectional shape of a rectangle or a rounded rectangle. Each first bonding pad 988 can have a lengthwise maximum dimension in a range from 2 microns to 60 microns, and a widthwise maximum dimension in a range from 2 microns to 60 microns, although lesser and greater dimensions may also be employed.

Generally, the first semiconductor die 900 can comprise a first substrate 908, first semiconductor devices 920, and first bonding pads 988 that are embedded in a first pad-level dielectric layer 971 and electrically connected to a respective node of the first semiconductor devices 920. Each first bonding pad 988 comprises a first metallic liner 988A contacting the first pad-level dielectric layer 971, and a first metallic fill material portion 988B that is laterally surrounded by the first metallic liner 988A and laterally spaced from the first pad-level dielectric layer 971. The first metallic liners 988A may comprise a metallic nitride material, and the first metallic fill material portions 988B may comprise copper.

Figure 1E:
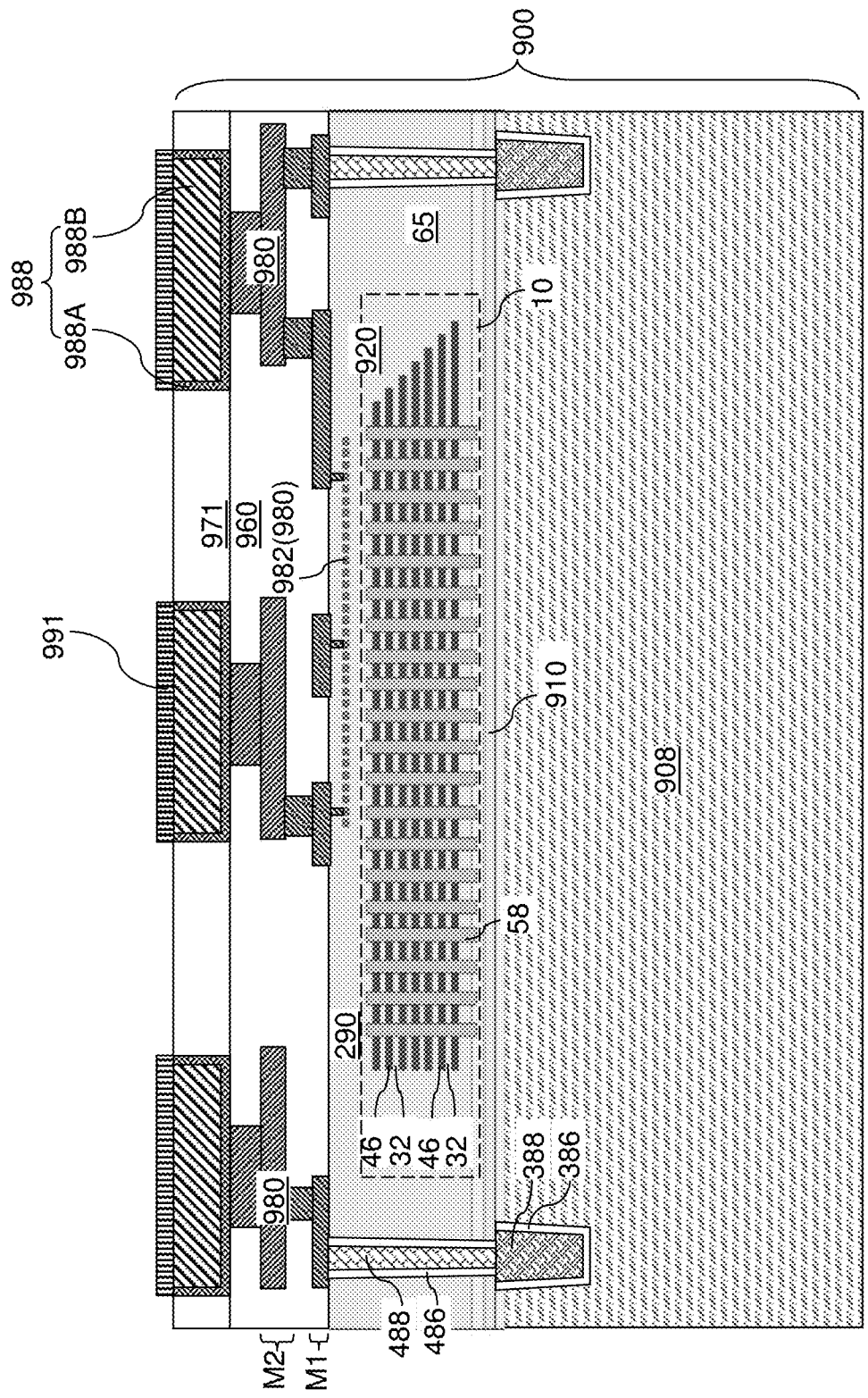
FIG. 1E is a schematic vertical cross-sectional view of the first semiconductor die after formation of first self-assembly material layers according to an embodiment of the present disclosure.

Referring to FIG. 1E, a first self-assembly monolayer (SAM) layer 991 can be selectively deposited on each physically exposed horizontal surface of the first bonding pads 988. The first SAM layer 991 can include a self-assembled monolayer of organic molecules. The first SAM layer 991 can be formed by a coating process in which the molecules of the first SAM layer 991 are chemically bonded to the physically exposed surfaces of the first bonding pads 988 without being attached to the physically exposed surfaces of the first pad-level dielectric layer 971. Thus, the first SAM layers 991 can be formed selectively on the physically exposed surfaces of the first bonding pads 988 without deposition on physically exposed surfaces of the first pad-level dielectric layer 971.

In one embodiment, the self-assembly material may include a thiol with a SH head group, such as an alkane thiol precursor compound having a first end with affinity to the metallic material(s) of the first bonding pads 988 and without affinity to the material of the first pad-level dielectric layer 971 (such as silicon oxide). Thus, the SAM may be self-assembled onto the physically exposed surfaces of the first bonding pads 988 without being attached to the first pad-level dielectric layer 971. In one embodiment, the first SAM layer 991 may include a first self-assembly material having a first end having a first head group (e.g., SH group) attached to the first bonding pads 988, and a second end having a first terminal (also known as tail or functional) group. The first terminal group can be selected to prevent deposition of a first metal-containing precursor layer for subsequent conversion into a metal-organic framework (MOF) material. Generally, any tail group that suppresses deposition of a metal oxide material can be employed for the first terminal group.

Figure 1F:
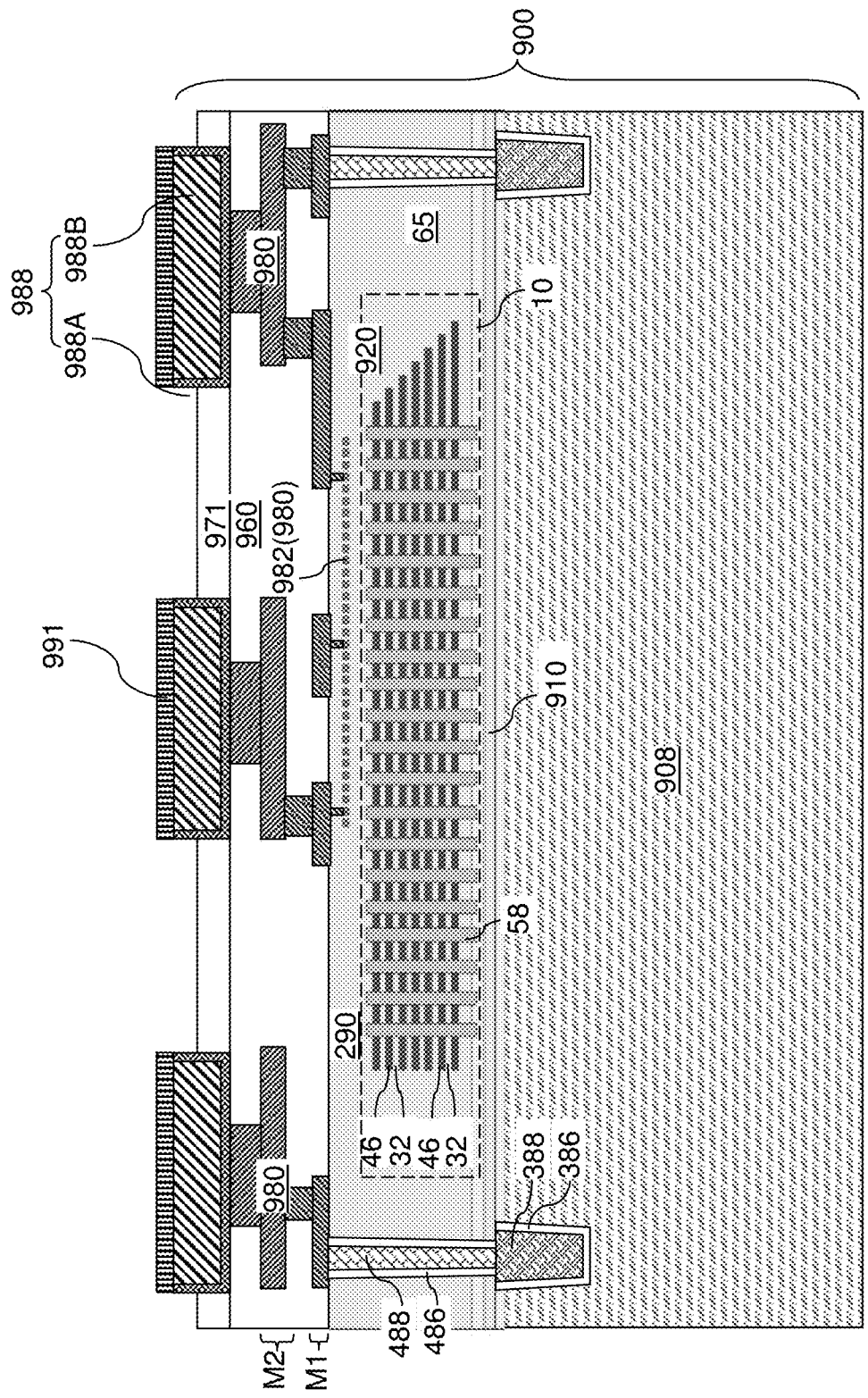
FIG. 1F is a schematic vertical cross-sectional view of the first semiconductor die after vertically recessing the first pad-level dielectric layer according to an embodiment of the present disclosure.

Referring to FIG. 1F, the first pad-level dielectric layer 971 can be vertically recessed by performing an etch process that selectively etches the dielectric material of the first pad-level dielectric layer 971 without etching the metallic materials of the first bonding pads 988 and without etching the first SAM layer 991. For example, if the first pad-level dielectric layer 971 includes undoped silicate glass (e.g., silicon oxide) or a doped silicate glass, a wet etch process employing dilute hydrofluoric acid can be performed to vertically recess the first pad-level dielectric layer 971 relative to the first bonding pads 988. The remaining portion of the first pad-level dielectric layer 971 can have a first recessed dielectric surface that is vertically recessed from the horizontal plane including the top surfaces of the first bonding pads 988 by a vertical recess distance that is less than the initial thickness of the first pad-level dielectric layer 971. The vertical recess distance may be in a range from 10% to 90%, such as from 25% to 75%, of the initial thickness of the first pad-level dielectric layer 971. Portions of the sidewalls of the first bonding pads 988 that are distal from the first substrate 908 are herein referred to as distal portions of sidewalls of the first bonding pads 988. Portions of the sidewalls of the first bonding pads 988 that are proximal to the first substrate 908 are herein referred to as proximal portions of sidewalls of the first bonding pads 988. The distal portions of sidewalls of the first bonding pads 988 can be physically exposed by the recess etch process. In one embodiment, the distal portions of sidewalls of the first bonding pads 988 can be physically exposed after formation of the first SAM layers 991 while the first SAM layers 991 are present on the horizontal surfaces of the first bonding pads 988.

In an alternative embodiment, the order of the processing steps of FIGS. 1E and 1F may be reversed. In this case, the physically exposed horizontal surface of the first pad-level dielectric layer 971 may be vertically recessed after the processing steps of FIG. 1D by performing an etch process that selectively etches the dielectric material of the first pad-level dielectric layer 971 without etching the metallic materials of the first bonding pads 988. The vertical recess distance may be a range from 10% to 90%, such as from 25% to 75%, of the initial thickness of the first pad-level dielectric layer 971. Subsequently, the processing steps of FIG. 1E may be performed to form the first SAM layers 991 on the physically exposed horizontal (i.e., top) and vertical (i.e., sidewall) surfaces of the first bonding pads 988.

Figure 1G:
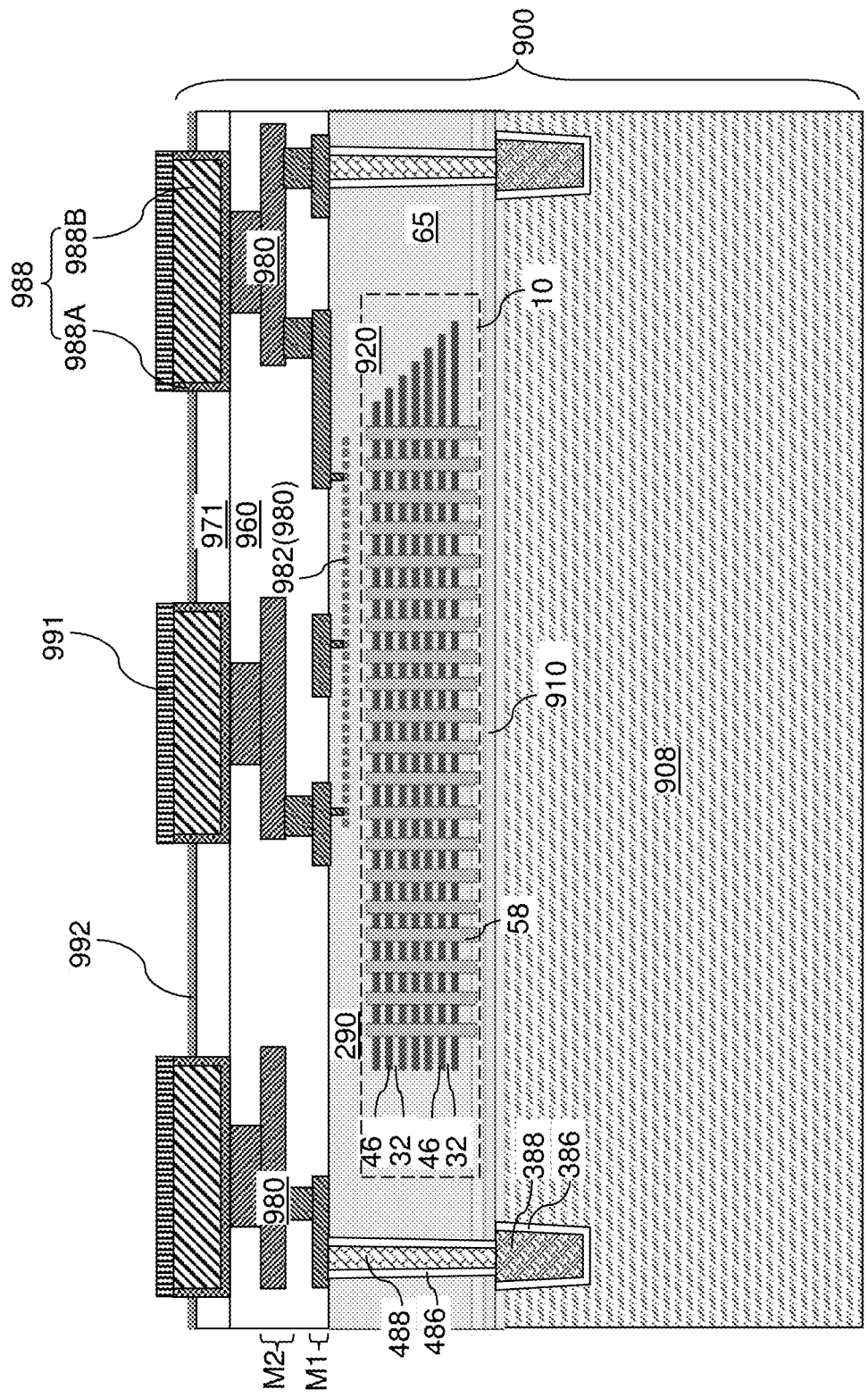
FIG. 1G is a schematic vertical cross-sectional view of the first semiconductor die after formation of a first metal-containing precursor layer according to an embodiment of the present disclosure.

Referring to FIG. 1G, a first metal-containing precursor layer 992 can be formed on the first recessed dielectric surface of the first pad-level dielectric layer 971. The first metal-containing precursor layer 992 may, or may not, be formed on the sidewalls of the first bonding pads 988 depending on whether the first SAM layers 991 are present on the sidewalls of the first bonding pads 988 or not. The first metal-containing precursor layer 992 is not formed on the first SAM layers 991. Thus, the first metal-containing precursor layer 992 is not formed over the horizontal surfaces of the first bonding pads 988.

The first metal-containing precursor layer 992 includes a metal-containing precursor material that forms a metal-organic framework (MOF) material upon exposure to a vapor of a linking compound (i.e., a linker precursor). The first metal-containing precursor layer 992 can be formed by selective conformal deposition of the metal-containing precursor material. The first SAM layers 991 prevent deposition of the metal-containing precursor material thereupon. For example, a chemical vapor deposition process or an atomic layer deposition process can be employed to deposit the first metal-containing precursor layer 992.

Metal-organic frameworks (MOF's) are porous crystalline materials that are formed by linking inorganic and organic units with strong bonds in a structure that forms a cavity having dimensions greater than the size of an individual atom. MOF's can be coordination polymers that include metal ions or clusters that are coordinated to organic ligands to form a porous three-dimensional structure. Each metal ion or cluster is connected to at least a bidentate organic ligand (i.e., two or more ligands). The organic ligands form a coordination network containing voids around the metal ions or clusters. Over 20,000 different types of MOF's have been reported. MOF's are dielectric materials and typically have a low dielectric constant, which may be in a range from 1.7 to 2.6.

Methods for forming MOF's have been disclosed in recently published articles such as M. Krishtab et al., *Vapor-deposited zeolitic imidazolate frameworks as gap-filling ultra-low-k dielectrics*, Nature Communications, 10:3729 (2019); T. Stassin, *Vapour-phase deposition of oriented copper dicarboxylate metal-organic framework thin films*, Chem Commun, 2019 Sep. 4; 55(68):10056-10059; and E. Perez, *Origins and Evolution of Inorganic-Based and MOF-Based Mixed-Matrix Membranes for Gas Separations*, Processes 4(3):32, September 2016, the entire contents of which are incorporated herein by reference. In such methods, a metal-containing precursor material is deposited and is subsequently converted into a MOF material upon reaction with a linker precursor vapor.

For example, the first metal-containing precursor layer 992 can include, and/or can consist essentially of, an elemental metal, a metal oxide material, a metal nitride material, or a metal carbide material. In case the first metal-containing precursor layer 992 includes an elemental metal, the first metal-containing precursor layer 992 can include, and/or can consist essentially of, any metal that can form a MOF, such as titanium, molybdenum, copper, cobalt, zirconium, zinc, manganese, or ruthenium. In case the first metal-containing precursor layer 992 includes a metal oxide material, the first metal-containing precursor layer 992 can include, and/or can consist essentially of, titanium oxide, molybdenum oxide, copper oxide, cobalt oxide, zirconium oxide, zinc oxide, manganese oxide, or ruthenium oxide. In case the first metal-containing precursor layer 992 includes a metal nitride material, the first metal-containing precursor layer 992 can include, and/or can consist essentially of, titanium nitride, molybdenum nitride, copper nitride, cobalt nitride, zirconium nitride, zinc nitride, manganese nitride, or ruthenium nitride. In case the first metal-containing precursor layer 992 includes a metal carbide material, the first metal-containing precursor layer 992 can include, and/or can consist essentially of, titanium carbide, molybdenum carbide, copper carbide, cobalt carbide, zirconium carbide, zinc carbide, manganese carbide, or ruthenium carbide. The thickness of the first metal-containing precursor layer 992 can be in a range from 5% to 40%, such as from 10% to 20% of the vertical recess distance by which the planar top surface of the first pad-level dielectric layer 971 is vertically recessed. Generally, the thickness of the first metal-containing precursor layer 992 can be selected to subsequently generate an amount of a MOF material that is sufficient to fill the entire recess volume by which the volume of the first pad-level dielectric layer 971 shrunk during the etch process of FIG. 1F. For example, the thickness of the first metal-containing precursor layer 992 can be in a range from 10 nm to 100 nm, such as from 20 nm to 50 nm. In one embodiment, the first metal-containing precursor layer 992 may comprise at least one metal element that is not present in the first bonding pads 988 and in the second bonding pads to be subsequently formed in a second semiconductor die.

Figure 1H:
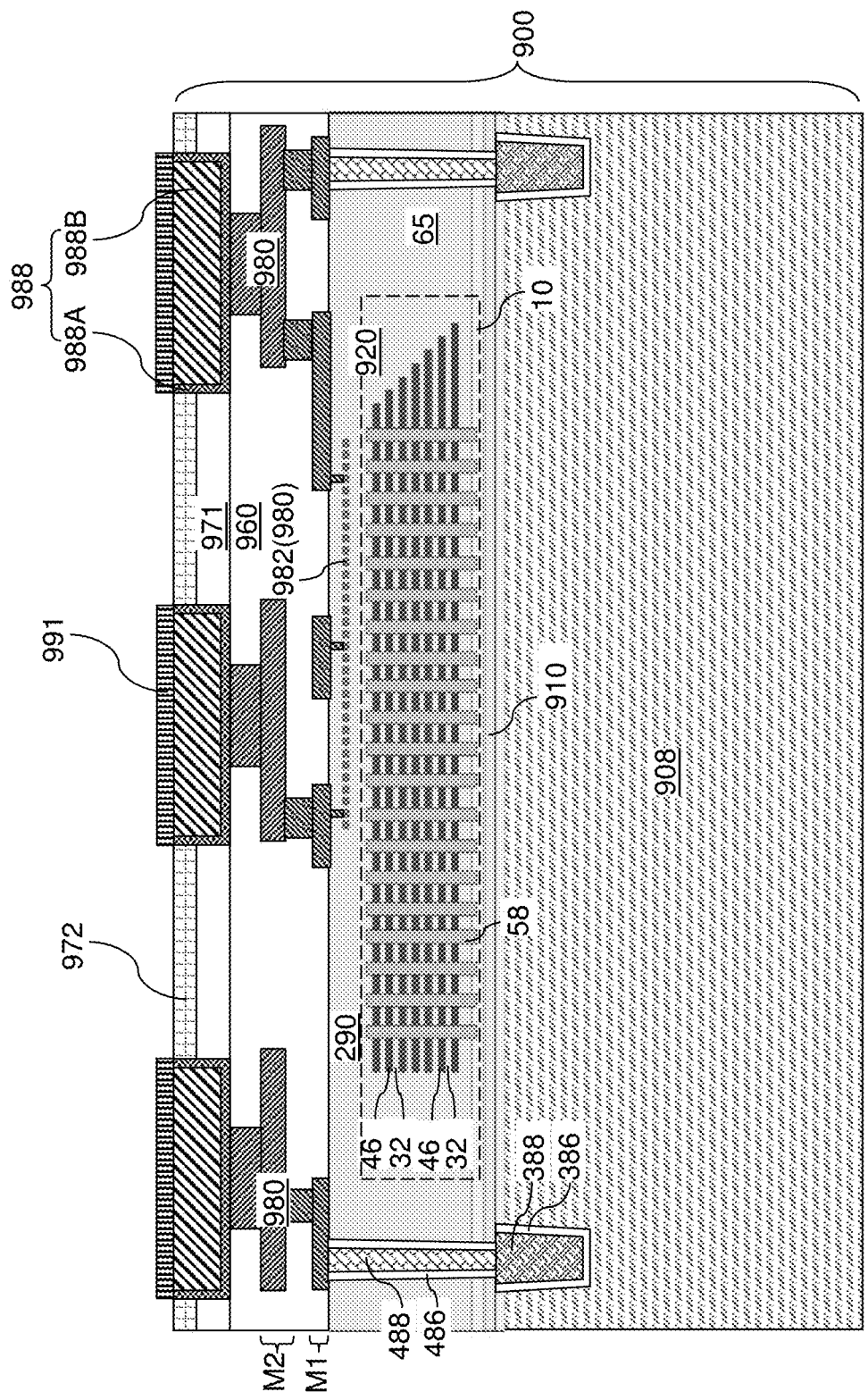
FIG. 1H is a schematic vertical cross-sectional view of the first semiconductor die after formation of a first metal-organic framework (MOF) dielectric layer according to an embodiment of the present disclosure.

Referring to FIG. 1H, a first metal-organic framework (MOF) dielectric layer 972 can be formed by reacting the first metal-containing precursor layer 992 with a first vapor of a first linking compound. The first MOF dielectric layer 972 can laterally surround the first bonding pads 988. For example, the first semiconductor die 900 can be placed in a vacuum-tight reaction chamber. An oxidation process can be performed to convert the material of the first metal-containing precursor layer 992 into a metal oxide material in case the first metal-containing precursor layer 992 includes an elemental metal, a metal nitride, or a metal carbide. In case the first metal-containing precursor layer 992 includes a metal oxide material, the oxidation process may be omitted.

The metal oxide material of the first metal-containing precursor layer 992, or the metal oxide material derived from the first metal-containing precursor layer 992, is exposed to the first vapor of the first linking compound (e.g., organic linking compound) that forms a metal-organic framework (MOF) material upon reaction. Any combination of a metallic material for the first metal-containing precursor layer 992 and the first vapor of the first linking compound that is known to form a MOF material may be employed. Generally, the molecular species for the first vapor of the first linking compound can be selected based on the metallic material in the first metal-containing precursor layer 992. For example, if the first metal-containing precursor layer 992 includes zinc, a vapor of 1,4-benzodicarboxylate (e.g., 1,4-benzodicarboxylic acid) can be employed as the organic linker to form MOF-5, which includes $ZnO_4$ nodes and 1,4-benzodicarboxylic acid organic linkers that form the framework, that contains large pores between the structure of the framework. For example, if the first metal-containing precursor layer 992 includes titanium (e.g., titanium dioxide), a vapor of 1,4-benzodicarboxylate (e.g., 1,4-benzodicarboxylic acid) can be employed as the organic linker to form MOF MIL-125, which includes titanium containing nodes and 1,4-benzodicarboxylic acid organic linkers that form the framework, that contains large pores between the structure of the framework.

The first MOF dielectric layer 972 can be formed by reaction of the first metal-containing precursor layer 992 and the first vapor of the first linking compound. The first metal-containing precursor layer 992 can be completely consumed during the optional oxidation process and subsequent conversion into the first MOF dielectric layer 972. Various MOF materials can be formed depending on the composition of the first metal-containing precursor layer 992. For example, if the first metal-containing precursor layer 992 includes titanium, a titanium-based MOF, such as MIL-125 can be formed. If the first metal-containing precursor layer 992 includes molybdenum, a molybdenum-based MOF, such as TUDMOF-1 can be formed. The composition of the MOF material portions depends on the composition of the first metal-containing precursor layer 992 and the composition of the linking compound.

The first MOF dielectric layer 972 includes metal-organic framework (MOF) material portions that are formed by reacting the first metal-containing precursor layer 992 with the first vapor of the first linking compound. The MOF material portions comprise a metal-organic framework material including metal ions or clusters and organic ligands located between neighboring pairs of the metal ions or clusters. Each metal ion or cluster is connected to at least two organic ligands (i.e., organic linkers). In one embodiment, the thickness of the first metal-containing precursor layer 992 can be selected such that the first MOF dielectric layer 972 fills the entirety of the recess volume formed by vertical recessing of the first pad-level dielectric layer 971. The top surface of the first MOF dielectric layer 972 may be at, the height of the top surfaces of the first bonding pads 988 or may be offset from the top surfaces of the first bonding pads 988 by less than 50 nm.

Referring to FIG. 2A, a second semiconductor die 700 is illustrated. The second semiconductor die 700 includes a second substrate 708, second semiconductor devices 720 overlying the second substrate 708, second dielectric material layers (760, 771) overlying the second semiconductor devices 720, and second metal interconnect structures 780 embedded in the second dielectric material layers (760, 771). In one embodiment, the second semiconductor devices 720 may include at least one complementary metal oxide semiconductor (CMOS) circuitry including field effect transistors. In one embodiment, the second substrate 708 may be a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive layers 46), and bit lines 982, the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second dielectric material layers (760, 771) can include second interconnect-level dielectric layers 760 embedding the second metal interconnect structures 780, and a second pad-level dielectric layer 771 that is formed above the second interconnect-level dielectric layers 760. The second interconnect-level dielectric layers 760 may include a dielectric material such as undoped silicate glass (e.g., silicon oxide), a doped silicate glass, organosilicate glass, silicon nitride, a dielectric metal oxide, or a combination thereof. In an illustrative example, the second metal interconnect structures 780 may include a first logic-side metal level D0 including logic-side first-level metal lines, and a second logic-side metal level D1 including logic-side second-level metal lines.

The second pad-level dielectric layer 771 may comprise, or consist essentially of, undoped silicate glass, a doped silicate glass, organosilicate glass, silicon nitride, or a dielectric metal oxide. The thickness of the second pad-level dielectric layer 771 may be in a range from 100 nm to 3,000 nm, although lesser and greater thicknesses may also be employed. The second pad-level dielectric layer 771 may have a planar top surface, which may be provided, for example, by a planarization process such as a chemical mechanical polishing (CMP) process.

Second pad cavities are formed through the second pad-level dielectric layer 771 by performing the processing steps of FIG. 1B. Second bonding pads 788 can be formed in each second pad cavity by performing the processing steps of FIGS. 1C and 1D. Each second bonding pad 788 can include a second metallic liner 788A and a second metallic fill material portion 788B. Each second metallic liner 788A can include a metallic liner material such as TiN, TaN, WN, TiC, TaC, WC, or a stack thereof. The thickness of horizontal portions of the second metallic liners 788A can be in a range from 5 nm to 50 nm, although lesser and greater thicknesses can also be employed. The second metallic fill material portions 788B can include a metallic material that can be bonded by metal-to-metal bonding. For example, the second metallic fill material portions 788B can include copper or a copper-containing alloy.

Each second bonding pad 788 can have a horizontal cross-sectional shape of a rectangle or a rounded rectangle. Each second bonding pad 788 can have a lengthwise maximum dimension in a range from 2 microns to 60 microns, and a widthwise maximum dimension in a range from 2 microns to 60 microns, although lesser and greater dimensions may also be employed. The pattern of the second bonding pads 788 can be a mirror image pattern of the pattern of the first bonding pads 988. The second bonding pads 788 may have the same size as the first bonding pads 988, may have a greater size than the first bonding pads 988, or may have a smaller size than the first bonding pads 988.

Generally, the second semiconductor die 700 can comprise a second substrate 708, second semiconductor devices 720, and second bonding pads 788 that are embedded in a second pad-level dielectric layer 771 and electrically connected to a respective node of the second semiconductor devices 720. Each second bonding pads 788 comprises a second metallic liner 788A contacting the second pad-level dielectric layer 771, and a second metallic fill material portion 788B that is laterally surrounded by the second metallic liner 788A and laterally spaced from the second pad-level dielectric layer 771. The second metallic liners 788A comprise a metallic nitride material, and the second metallic fill material portions 788B comprise copper.

Figure 2B:
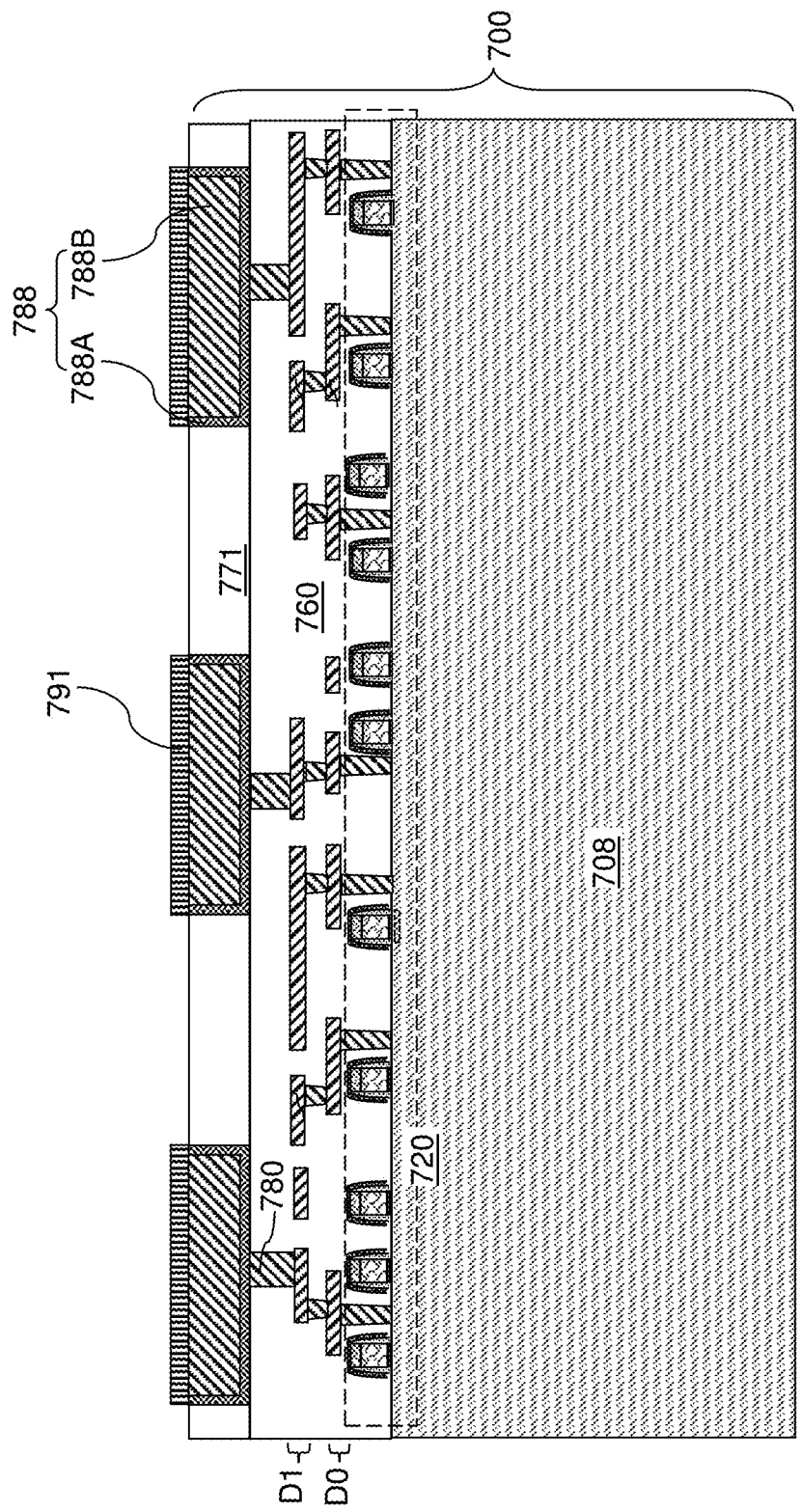
FIG. 2B is a schematic vertical cross-sectional view of the second semiconductor die after formation of first self-assembly material layers according to an embodiment of the present disclosure.

Referring to FIG. 2B, a second self-assembly monolayer (SAM) layer 791 can be selectively deposited on each physically exposed horizontal surface of the second bonding pads 788. The second SAM layer 791 can include a self-assembled monolayer of organic molecules. The second SAM layer 791 can be formed by a coating process in which the molecules of the second SAM layer 791 are chemically bonded to the physically exposed surfaces of the second bonding pads 788 without being attached to the physically exposed surfaces of the second pad-level dielectric layer 771. Thus, the second SAM layers 791 can be formed selectively on the physically exposed surfaces of the second bonding pads 788 without deposition on physically exposed surfaces of the second pad-level dielectric layer 771. Any SAM material that may be employed for the first SAM layer 991 can be employed as the SAM material of the second SAM layer 791. The SAMs of the first SAM layer 991 and the second SAM layer 771 may be the same or different from each other, as will be described in more detail with respect to FIG. 3B below.

Figure 2C:
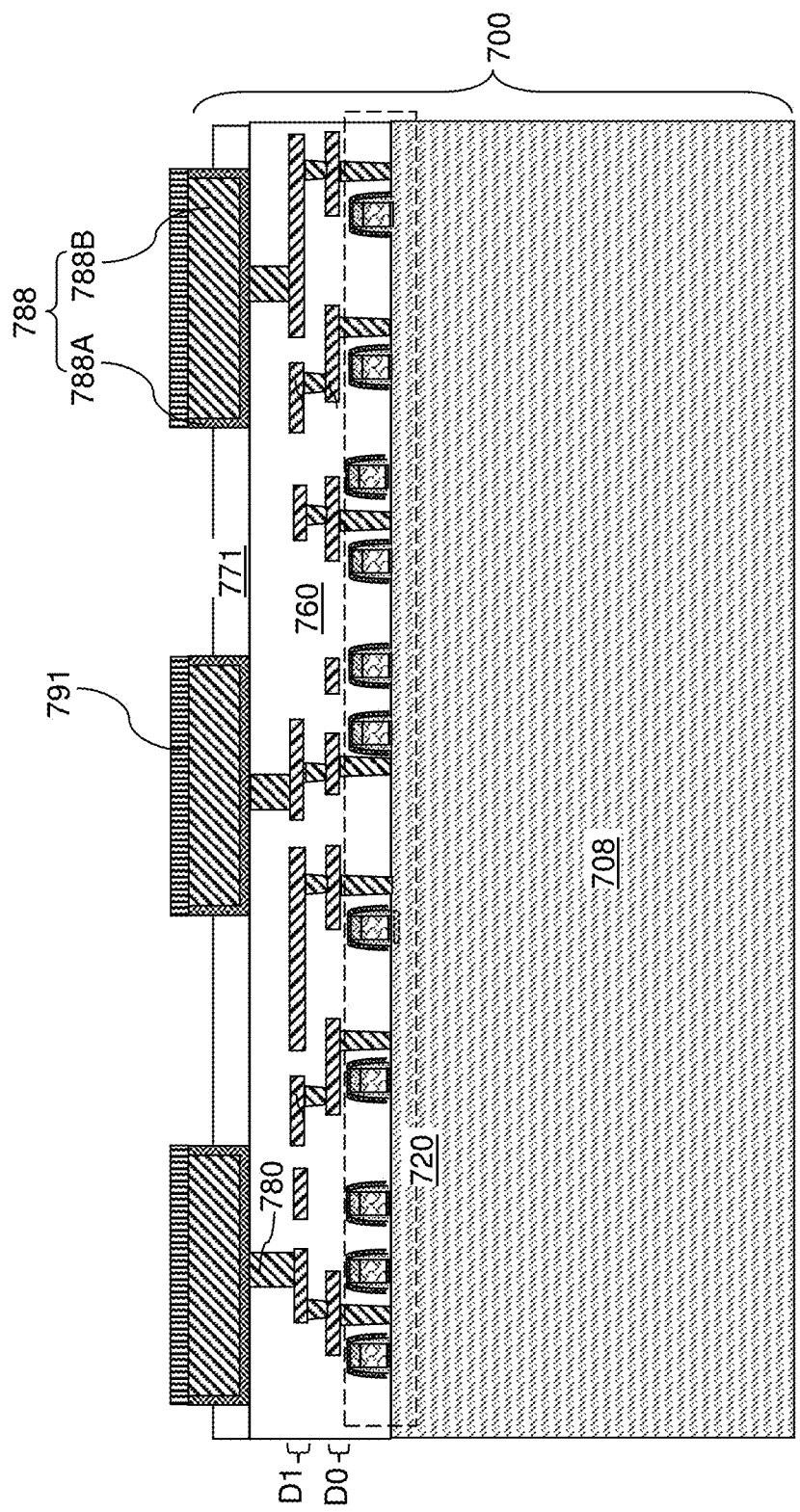
FIG. 2C is a schematic vertical cross-sectional view of the second semiconductor die after vertically recessing the second pad-level dielectric layer according to an embodiment of the present disclosure.

Referring to FIG. 2C, the second pad-level dielectric layer 771 can be vertically recessed by performing an etch process that selectively etches the dielectric material of the second pad-level dielectric layer 771 without etching the metallic materials of the second bonding pads 788 and without etching the second SAM layer 791. For example, if the second pad-level dielectric layer 771 includes undoped silicate glass (i.e., silicon oxide) or a doped silicate glass, a wet etch process employing dilute hydrofluoric acid can be performed to vertically recess the second pad-level dielectric layer 771 relative to the second bonding pads 788. The remaining portion of the second pad-level dielectric layer 771 can have a second recessed dielectric surface that is vertically recessed from the horizontal plane including the top surfaces of the second bonding pads 788 by a vertical recess distance that is less than the initial thickness of the second pad-level dielectric layer 771. The vertical recess distance may be in a range from 10% to 90%, such as from 25% to 75%, of the initial thickness of the second pad-level dielectric layer 771. Portions of the sidewalls of the second bonding pads 788 that are distal from the second substrate 708 are herein referred to as distal portions of sidewalls of the second bonding pads 788. Portions of the sidewalls of the second bonding pads 788 that are proximal to the second substrate 708 are herein referred to as proximal portions of sidewalls of the second bonding pads 788. The distal portions of sidewalls of the second bonding pads 788 can be physically exposed by the recess etch process. In one embodiment, the distal portions of sidewalls of the second bonding pads 788 can be physically exposed after formation of the second SAM layers 791 while the second SAM layers 791 are present on the horizontal surfaces of the second bonding pads 788.

In an alternative embodiment, the physically exposed horizontal surface of the second pad-level dielectric layer 771 may be vertically recessed after the processing steps of FIG. 2A by performing an etch process that selectively etches the dielectric material of the second pad-level dielectric layer 771 without etching the metallic materials of the second bonding pads 788. The vertical recess distance may be a range from 10% to 90%, such as from 25% to 75%, of the initial thickness of the second pad-level dielectric layer 771. Subsequently, the processing steps of FIG. 2B may be performed to form the second SAM layers 791 on the physically exposed horizontal (i.e., top) and vertical (i.e., sidewall) surfaces of the second bonding pads 788.

Figure 2D:
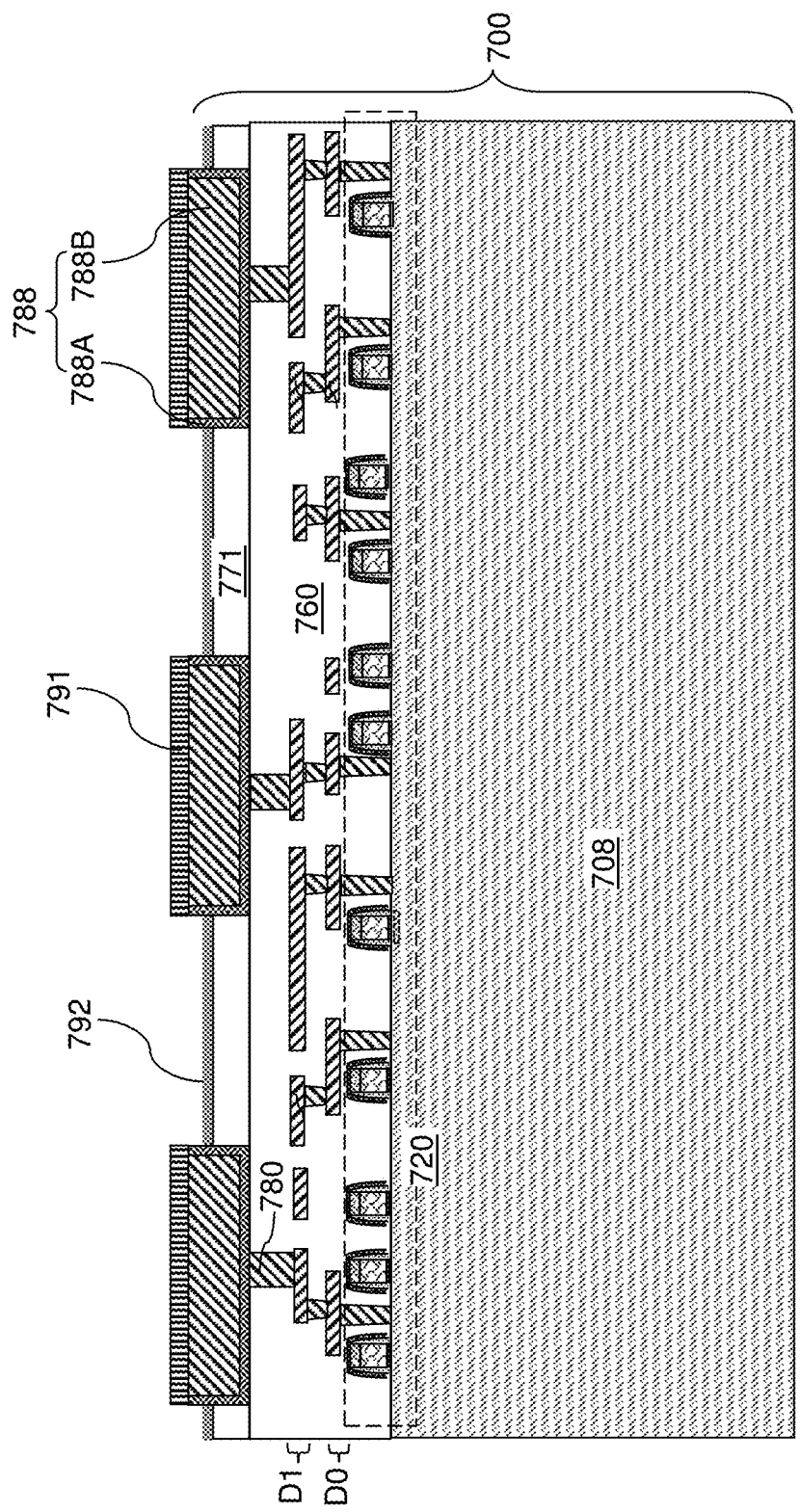
FIG. 2D is a schematic vertical cross-sectional view of the second semiconductor die after formation of a second metal-containing precursor layer according to an embodiment of the present disclosure.

Referring to FIG. 2D, a second metal-containing precursor layer 792 can be formed on the second recessed dielectric surface of the second pad-level dielectric layer 771. The second metal-containing precursor layer 792 may, or may not, be formed on the sidewalls of the second bonding pads 788 depending on whether the second SAM layers 791 are present on the sidewalls of the second bonding pads 788 or not. The second metal-containing precursor layer 792 is not formed on the second SAM layers 791. Thus, the second metal-containing precursor layer 792 is not formed over the horizontal surfaces of the second bonding pads 788.

The second metal-containing precursor layer 792 includes a metal-containing precursor material that forms a metal-organic framework (MOF) material upon exposure to a vapor of a linking compound (i.e., a linker precursor). The second metal-containing precursor layer 792 can be formed by selective conformal deposition of the metal-containing precursor material. The second SAM layers 791 prevent deposition of the metal-containing precursor material thereupon. For example, a chemical vapor deposition process or an atomic layer deposition process can be employed to deposit the second metal-containing precursor layer 792. Any material that may be employed for the first metal-containing precursor layer 992 can be employed for the second metal-containing precursor layer 792. As such, the second metal-containing precursor layer 792 can include, and/or can consist essentially of, an elemental metal, a metal oxide material, a metal nitride material, or a metal carbide material.

The thickness of the second metal-containing precursor layer 792 can be in a range from 5% to 40%, such as from 10% to 20% of the vertical recess distance by which the planar top surface of the second pad-level dielectric layer 771 is vertically recessed. Generally, the thickness of the second metal-containing precursor layer 792 can be selected to subsequently generate an amount of a MOF material that is sufficient to fill the entire recess volume by which the volume of the second pad-level dielectric layer 771 shrunk during the etch process of FIG. 2C. For example, the thickness of the second metal-containing precursor layer 792 can be in a range from 10 nm to 100 nm, such as from 20 nm to 50 nm. In one embodiment, the second metal-containing precursor layer 792 may comprise at least one metallic element that is not present in the second bonding pads 788 and in the second bonding pads to be subsequently formed in a second semiconductor die.

Figure 2E:
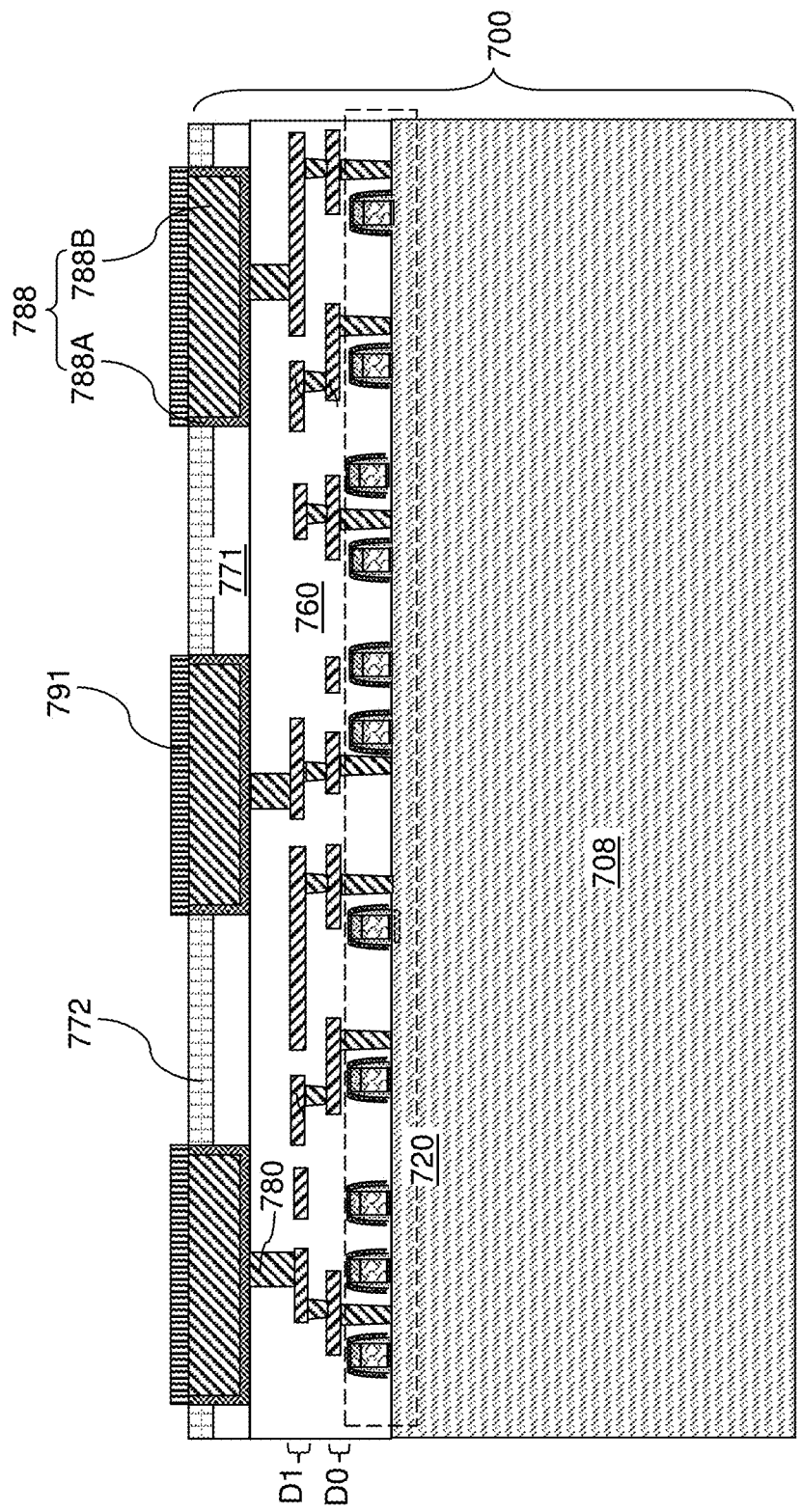
FIG. 2E is a schematic vertical cross-sectional view of the second semiconductor die after formation of a second metal-organic framework (MOF) dielectric layer according to an embodiment of the present disclosure.

Referring to FIG. 2E, a second metal-organic framework (MOF) dielectric layer 772 can be formed by reacting the second metal-containing precursor layer 792 with a second vapor of a second linking compound. The second MOF dielectric layer 772 can laterally surround the second bonding pads 788. For example, the second semiconductor die 700 can be placed in a vacuum-tight reaction chamber. An oxidation process can be performed to convert the material of the second metal-containing precursor layer 792 into a metal oxide material in case the second metal-containing precursor layer 792 includes an elemental metal, a metal nitride, or a metal carbide. In case the second metal-containing precursor layer 792 includes a metal oxide material, the oxidation process may be omitted.

The metal oxide material of the second metal-containing precursor layer 792, or the metal oxide material derived from the second metal-containing precursor layer 792, is exposed to the second vapor of the second linking compound (e.g., organic linking compound) that forms a metal-organic framework (MOF) material upon reaction. Any combination of a metallic material for the second metal-containing precursor layer 792 and the second vapor of the second linking compound that is known to form a MOF material may be employed. Generally, the molecular species for the second vapor of the second linking compound can be selected based on the metallic material in the second metal-containing precursor layer 792. The second MOF dielectric layer 772 can be formed by reaction of the second metal-containing precursor layer 792 and the second vapor of the second linking compound. The second metal-containing precursor layer 792 can be completely consumed during the optional oxidation process and subsequent conversion into the second MOF dielectric layer 772. Various MOF materials can be formed depending on the composition of the second metal-containing precursor layer 792.

The second MOF dielectric layer 772 includes metal-organic framework (MOF) material portions that are formed by reacting the second metal-containing precursor layer 792 with the second vapor of the second linking compound. The MOF material portions comprise a metal-organic framework material including metal ions or clusters and organic ligands located between neighboring pairs of the metal ions or clusters, and each metal ion or cluster bonded to two or more organic ligands (i.e., linkers). In one embodiment, the thickness of the second metal-containing precursor layer 792 can be selected such that the second MOF dielectric layer 772 fill the entirety of the recess volume formed by vertical recessing of the second pad-level dielectric layer 771. The top surface of the second MOF dielectric layer 772 may be at, or about, the height of the top surfaces of the second bonding pads 788.

Figure 3A:
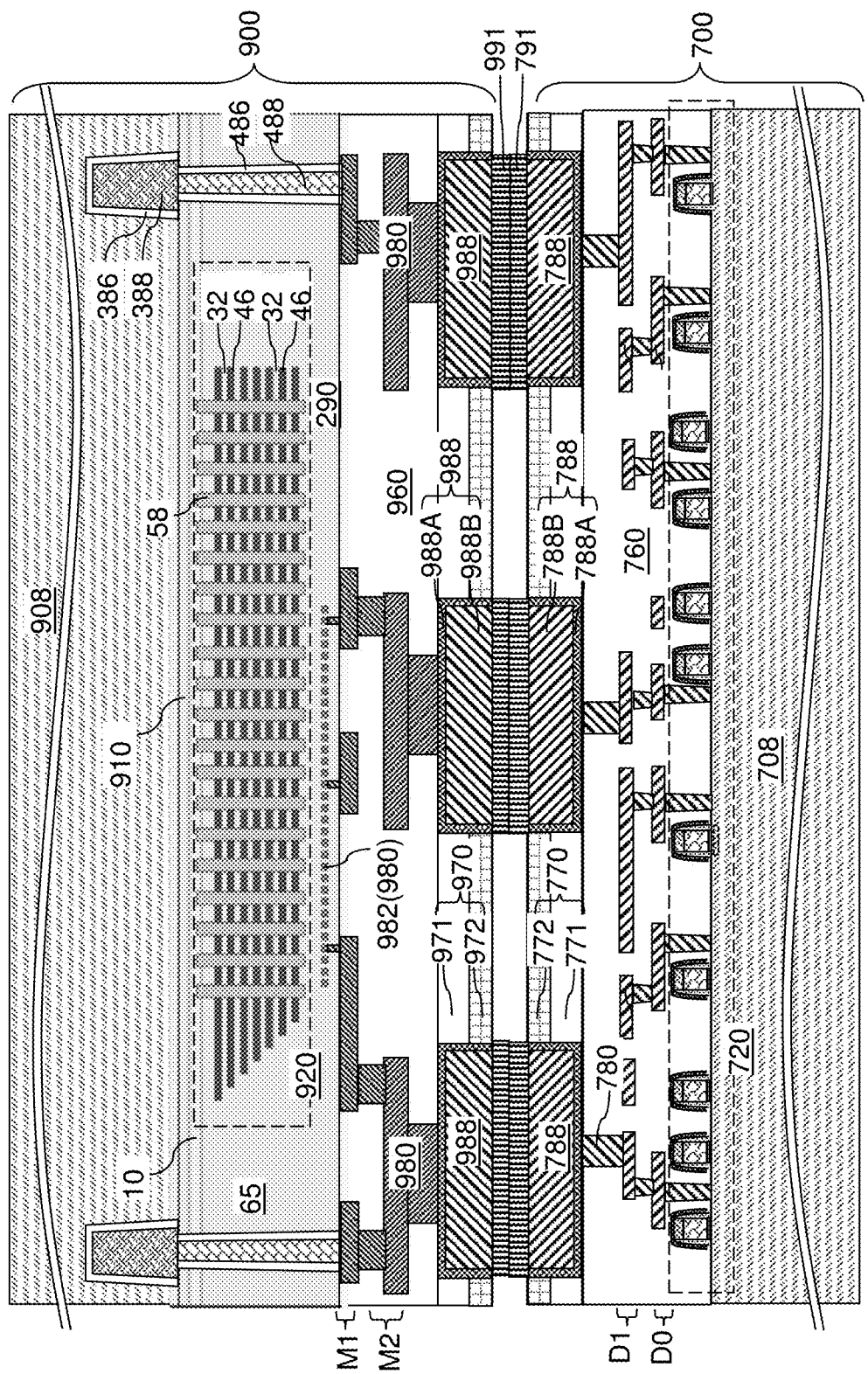
FIG. 3A is a schematic vertical cross-sectional view of a first exemplary structure including the first semiconductor die and the second semiconductor die after disposing the first semiconductor die on the second semiconductor die according to an embodiment of the present disclosure.

Referring to FIG. 3A, the first semiconductor die 900 and the second semiconductor die 700 are oriented such that the first MOF dielectric layer 972 faces the second MOF dielectric layer 772. The second semiconductor die 700 and the first semiconductor die 900 are brought into contact such that a surface of the second MOF dielectric layer 772 contacts a surface of the first MOF dielectric layer 972, and each of the second bonding pads 788 faces, and has an areal overlap in a plan view with, a respective one of the first bonding pads 988. In one embodiment, the pattern of the second bonding pads 788 may be a mirror image of the pattern of the first bonding pads 988 with optional differences in the size of bonding pads between the first semiconductor die 900 and the second semiconductor die 700. In one embodiment, the first bonding pads 988 and the corresponding second bonding pads 788 may have the same size (i.e., lateral width). In another embodiment, the first bonding pads 988 and the corresponding second bonding pads 788 may have different sizes. In one embodiment, areal overlap between each facing pair of a first bonding pad 988 and a second bonding pad 788 may be at least 80%, and/or at least 90%, such as 90 to 100%, of the area of the smaller one of the first bonding pad 988 and the second bonding pad 788.

The first semiconductor die 900 includes a vertical stack of a first pad-level dielectric layer 971 and a first MOF dielectric layer 972. The vertical stack of the first pad-level dielectric layer 971 and the first MOF dielectric layer 972 is herein referred to as a first composite dielectric layer 970.

The second semiconductor die 700 includes a vertical stack of a second pad-level dielectric layer 771 and a second MOF dielectric layer 772. The vertical stack of the second pad-level dielectric layer 771 and the second MOF dielectric layer 772 is herein referred to as a second composite dielectric layer 770.

Figure 3B:
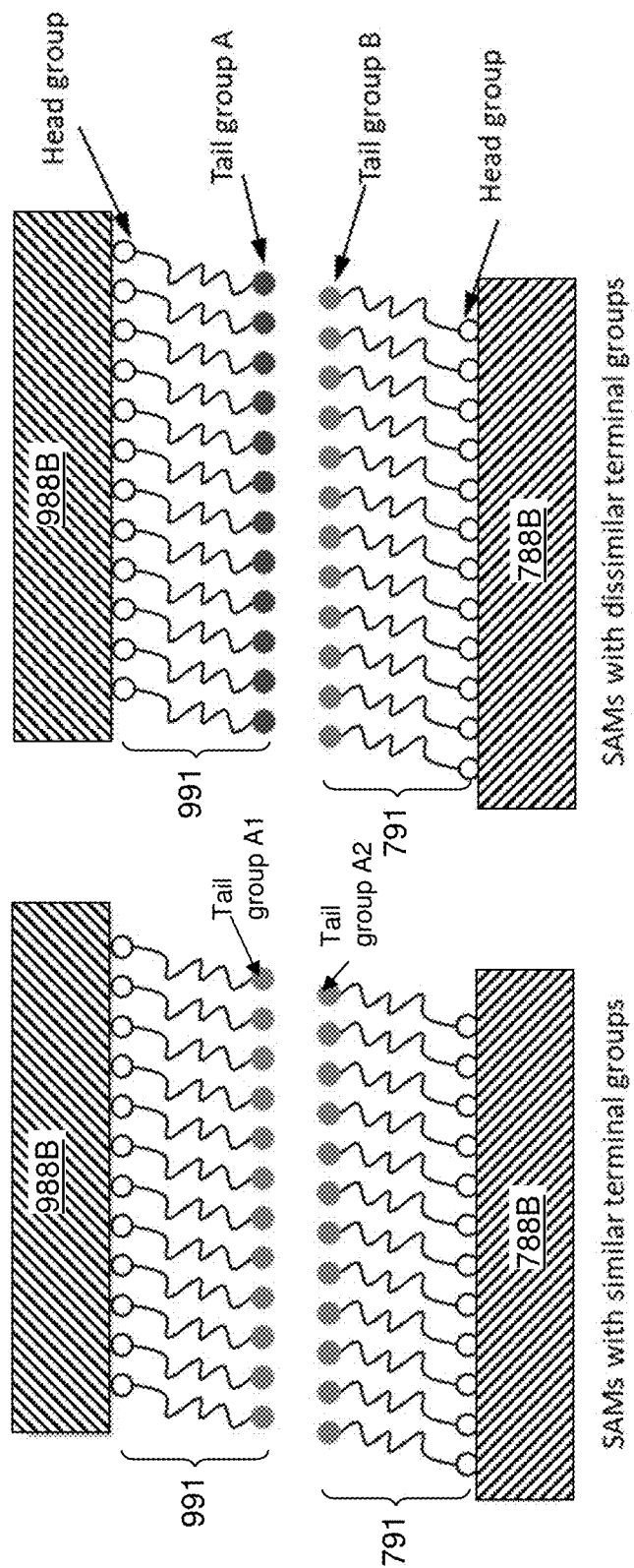
FIG. 3B illustrate configurations of self-assembly material layers that can be employed in the first exemplary structure of FIG. 3A.

FIG. 3B illustrates magnified views of two exemplary configurations, in which a respective mating pair of a first bonding pad 988 and a second bonding pad 788 is shown at the processing step of FIG. 3A. In one embodiment, the first SAM layer 991 and the second SAM layer 791 may include a monolayer of an alkane thiol having a chemical formula of $CH_3(CH_2)_{n-1}SH$. Such an alkane thiol is known to selectively attach to copper surfaces without being attached to silicon oxide surfaces. The first SAM layer 991 may include an alkane thiol compound having a first end (i.e., a first SH head group) with affinity to the material of the first bonding pads 988 and without affinity to the material of the first pad-level dielectric layer 971, and having a second end (i.e., a first tail/terminal/functional group). The second SAM layer 791 may include another alkane thiol compound having a first end (i.e., a second SH head group) with affinity to the material of the second bonding pads 788 and without affinity to the material of the second pad-level dielectric layer 771 and having a second end (i.e., a second tail/terminal/functional group).

In a first configuration, the first SAM material can include a first tail group A1 that suppresses deposition of the material of the first metal-containing precursor layer 992, and the second SAM material can include a second tail group A2 that suppresses deposition of the material of the second metal-containing precursor layer 792. In the first configuration, the first tail group A1 may be the same as the second tail group A2.

In a second configuration, the first SAM material can include a first tail group A that suppresses deposition of the material of the first metal-containing precursor layer 992, and the second SAM material can include a second tail group B that suppresses deposition of the material of the second metal-containing precursor layer 792. In the second configuration, the first tail group A may be different from the second tail group B. Further, the first tail group A and the second tail group B can be selected such that first tail group A can be selectively bonded to the second group B upon alignment of the first bonding pads 988 to the second bonding pads 788. For example, a self-assembly material may include a thiol (e.g., sulfur containing) head group configured to bond to a copper bonding pad, a $CH_2$ backbone, and a methyl ($CH_3$) or a hydroxide tail group configured to bind to another similar or different tail group of the corresponding SAM bonded to the opposing corresponding bonding pad.

Figure 4:
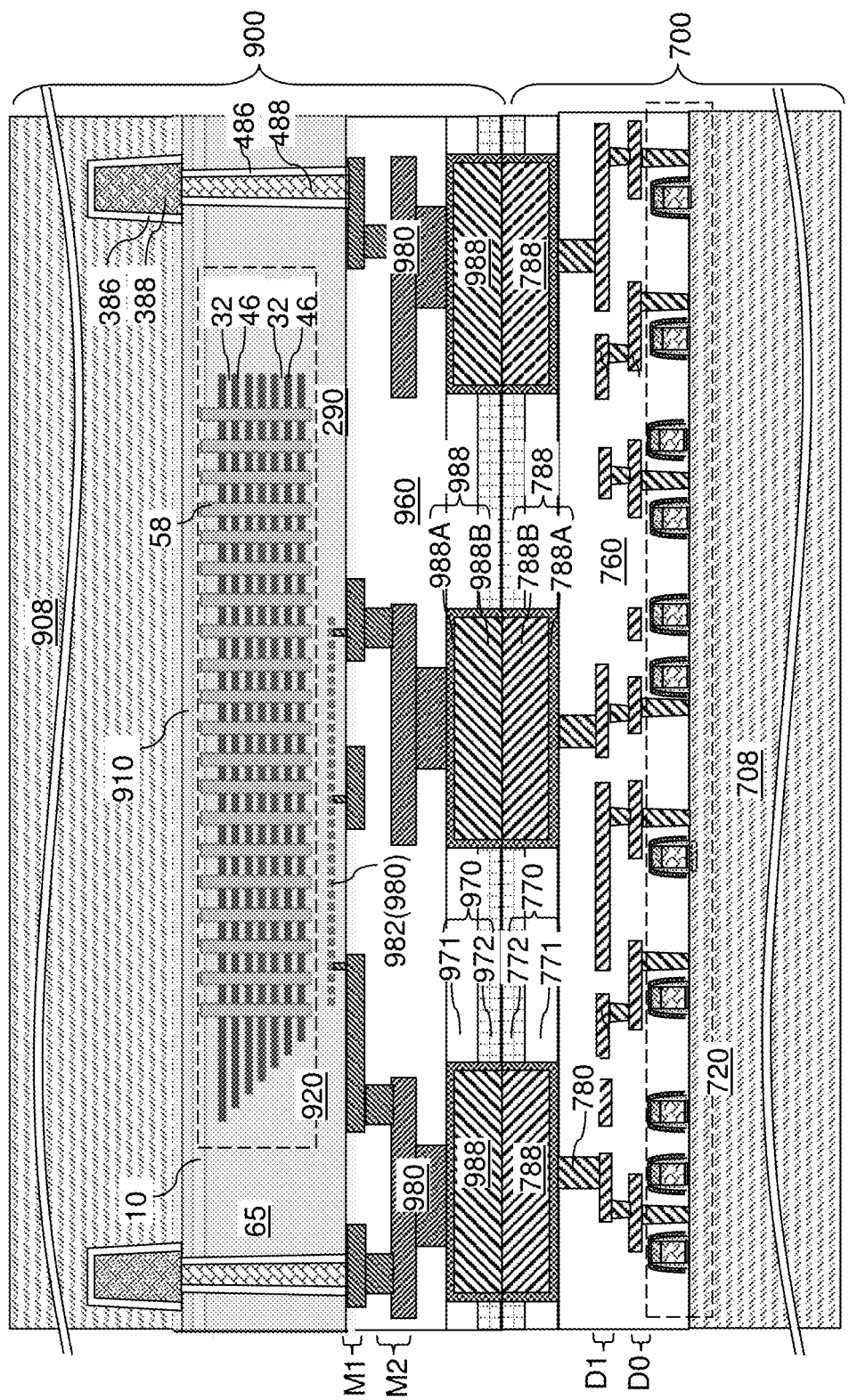
FIG. 4 is a schematic vertical cross-sectional view of the first exemplary structure after bonding the first semiconductor die to the second semiconductor die according to an embodiment of the present disclosure.

Referring to FIG. 4, the second bonding pads 788 may be bonded to the first bonding pads 988 by performing an anneal process that induces metal-to-metal bonding between the second bonding pads 788 and the first bonding pads 988. The anneal process may also optionally induce heterogeneous dielectric bonding between the first MOF dielectric layer 972 and the second MOF dielectric layer 772. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius, such as from 300 degrees Celsius to 350 degrees Celsius. The molecules of the first SAM layer 991 and the second SAM layer 791 may decompose during the anneal process, and may be evaporated or may be incorporated into the first bonding pads 988 and the second bonding pads 788 as impurity atoms. For example, the first bonding pads 988 and the second bonding pads 788 may include carbon atoms at an interfacial portion thereof. In the case of the first exemplary structure illustrated in FIG. 4, the first bonding pads 988 are bonded to the second bonding pads 788 after formation of the first MOF dielectric layer 972 and after formation of the second MOF dielectric layer 772.

Figure 5:
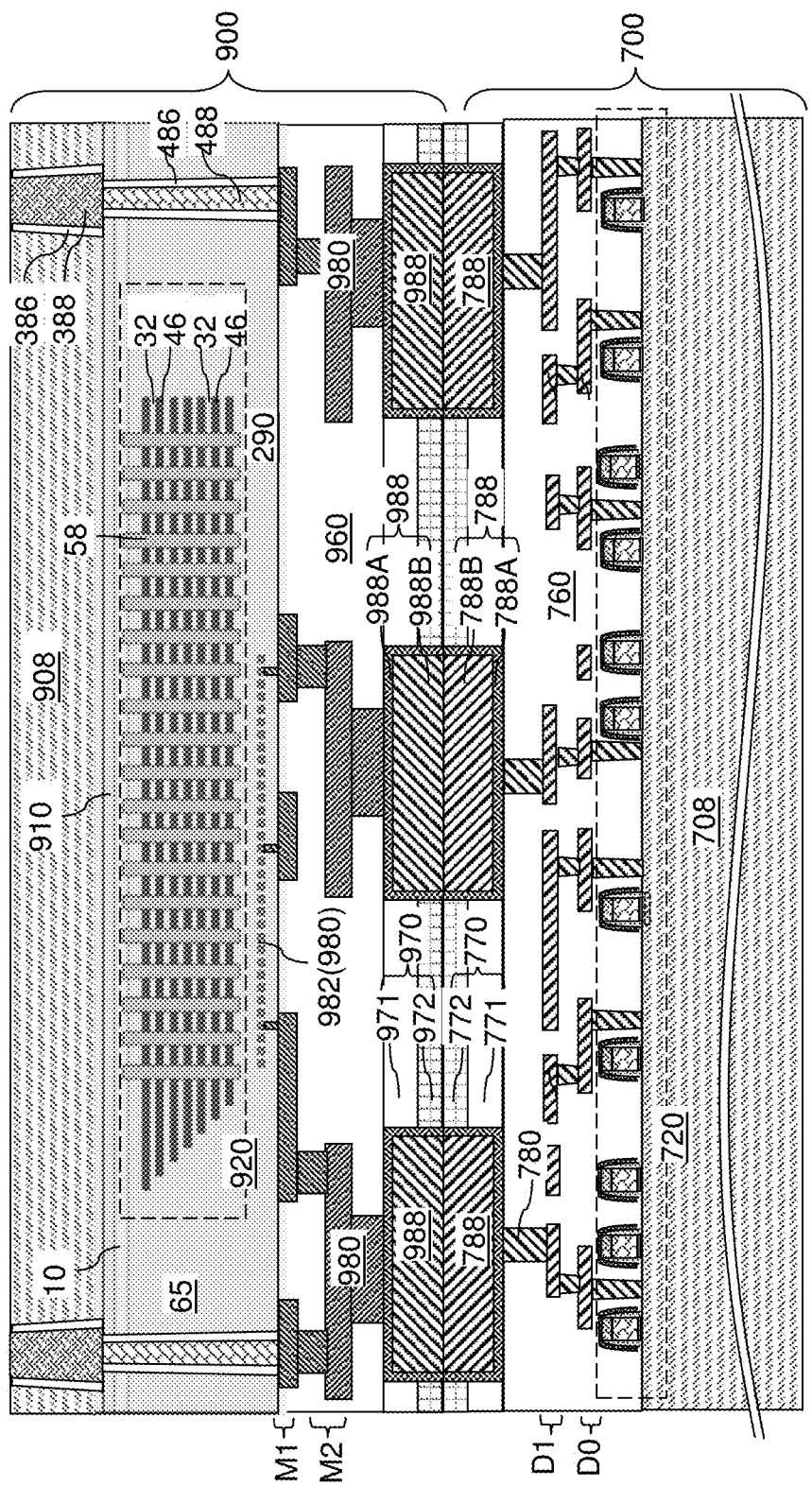
FIG. 5 is a schematic vertical cross-sectional view of the first exemplary structure after thinning the first semiconductor die from the backside according to an embodiment of the present disclosure.

Referring to FIG. 5, the first substrate 908 may be thinned from the backside by grinding, polishing, an anisotropic etch, or an isotropic etch. The thinning process can continue until horizontal portions of the through-substrate liners 386 are removed, and horizontal surfaces of the through-substrate via structures 388 are physically exposed. Generally, end surfaces of the through-substrate via structures 388 can be physically exposed by thinning the backside of the first substrate 908, which may be the substrate of a memory die.

Figure 6:
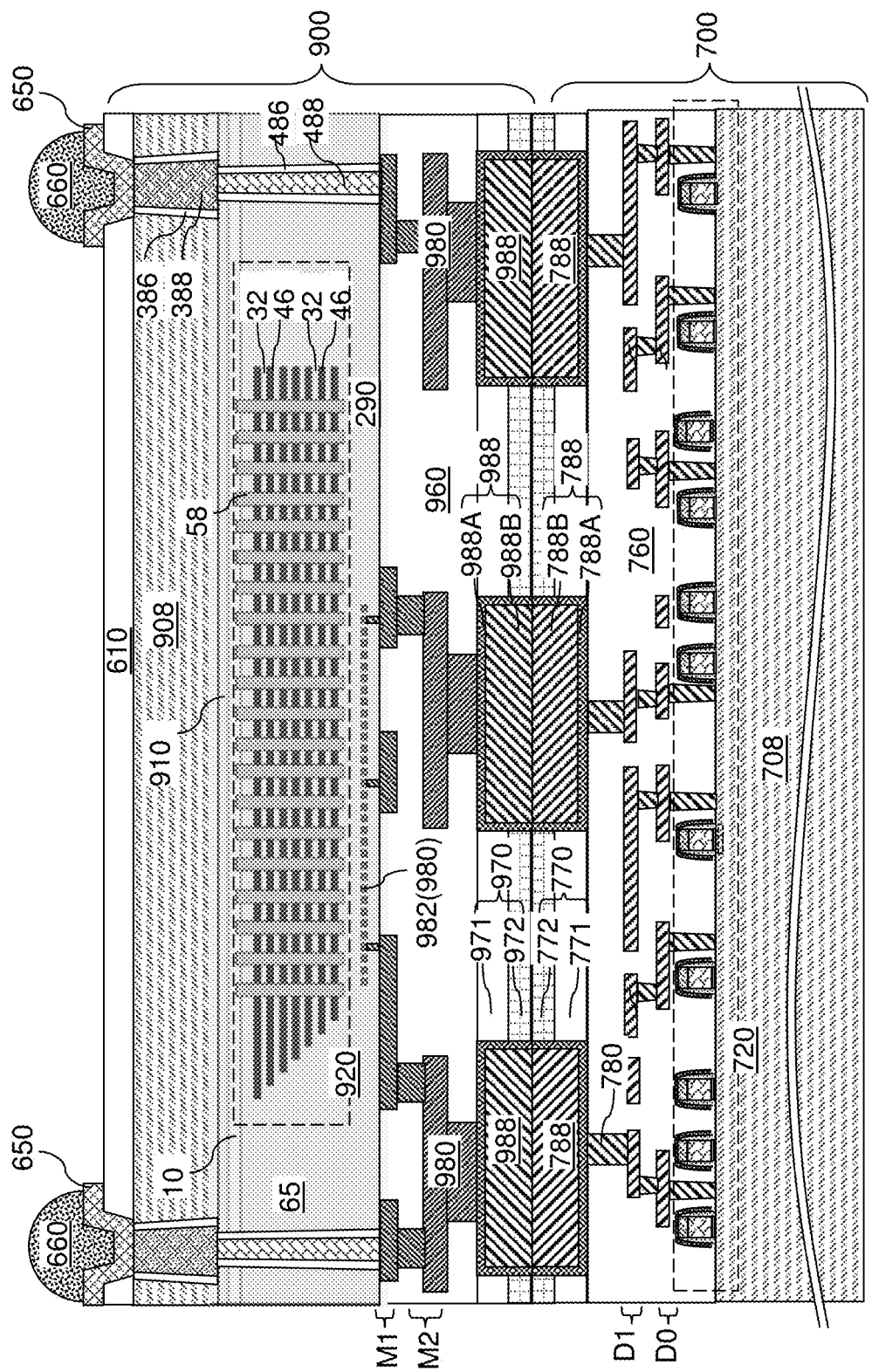
FIG. 6 is a schematic vertical cross-sectional view of the first exemplary structure after formation of a backside insulating layer, external bonding pads, and solder material portions according to an embodiment of the present disclosure.

Referring to FIG. 6, a backside insulating layer 610 may be formed on the backside of the second substrate 708. The backside insulating layer 610 includes an insulating material such as silicon oxide. The thickness of the backside insulating layer 610 can be in a range from 50 nm to 500 nm, although lesser and greater thicknesses can also be employed. A photoresist layer (not shown) may be applied over the backside insulating layer 610, and may be lithographically patterned to form opening over areas of the through-substrate via structures 388. An etch process can be performed to form via cavities through the backside insulating layer 610 underneath each opening in the photoresist layer. A top surface of a through-substrate via structure 388 can be physically exposed at the bottom of each via cavity through the backside insulating layer 610.

At least one metallic material can be deposited into the openings through the backside insulating layer 610 and over the planar surface of the backside insulating layer 610 to form a metallic material layer. The at least one metallic material can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner material (such as TiN, TaN, or WN) may be deposited directly on the physically exposed surfaces of the through-substrate via structures 388, on sidewalls of the openings through the backside insulating layer 610, and over the physically exposed planar surface of the backside insulating layer 610. The thickness of the metallic nitride liner material can be in a range from 10 nm to 100 nm, although lesser and greater thicknesses can also be employed. At least one metallic fill material such as copper or aluminum can be deposited over the metallic nitride liner material. In one embodiment, the at least one metallic fill material can include a stack of a high-electrical-conductivity metal layer (such as a copper layer or an aluminum layer) and an underbump metallurgy (UBM) layer stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, and a Cr/Cu/Ni stack. The thickness of the metallic material layer over the planar horizontal surface of the backside insulating layer 610 can be in a range from 0.5 microns to 10 microns, such as from 1 micron to 5 microns, although lesser and greater thicknesses can also be employed.

The at least one metallic fill material and the metallic material layer can be subsequently patterned to form discrete backside bonding pads 650 contacting a respective one of the through-substrate via structures 388. The backside bonding pads 650 can function as external bonding pads that can be employed to electrically connect various nodes of within the first semiconductor die 900 and the second semiconductor die 700 to external nodes, such as bonding pads on a packaging substrate or C4 bonding pads of another semiconductor die. For example, solder material portions 660 can be formed on the backside bonding pads 650, and a C4 bonding process or a wire bonding process can be performed to electrically connect the backside bonding pads 650 to external electrically active nodes.

Generally, backside bonding pads 650 can be formed on a backside surface of the first semiconductor die 900 (which may be a memory die) that is located on an opposite side of the bonding interface between the first semiconductor die 900 and the second semiconductor die 700. Through-substrate via structures 388 can vertically extend through the first semiconductor die 900, and can provide electrical connection between the backside bonding pads 650 and a subset of the bonding pads (988, 788), which can include input-output bonding pads.

Figure 7A:
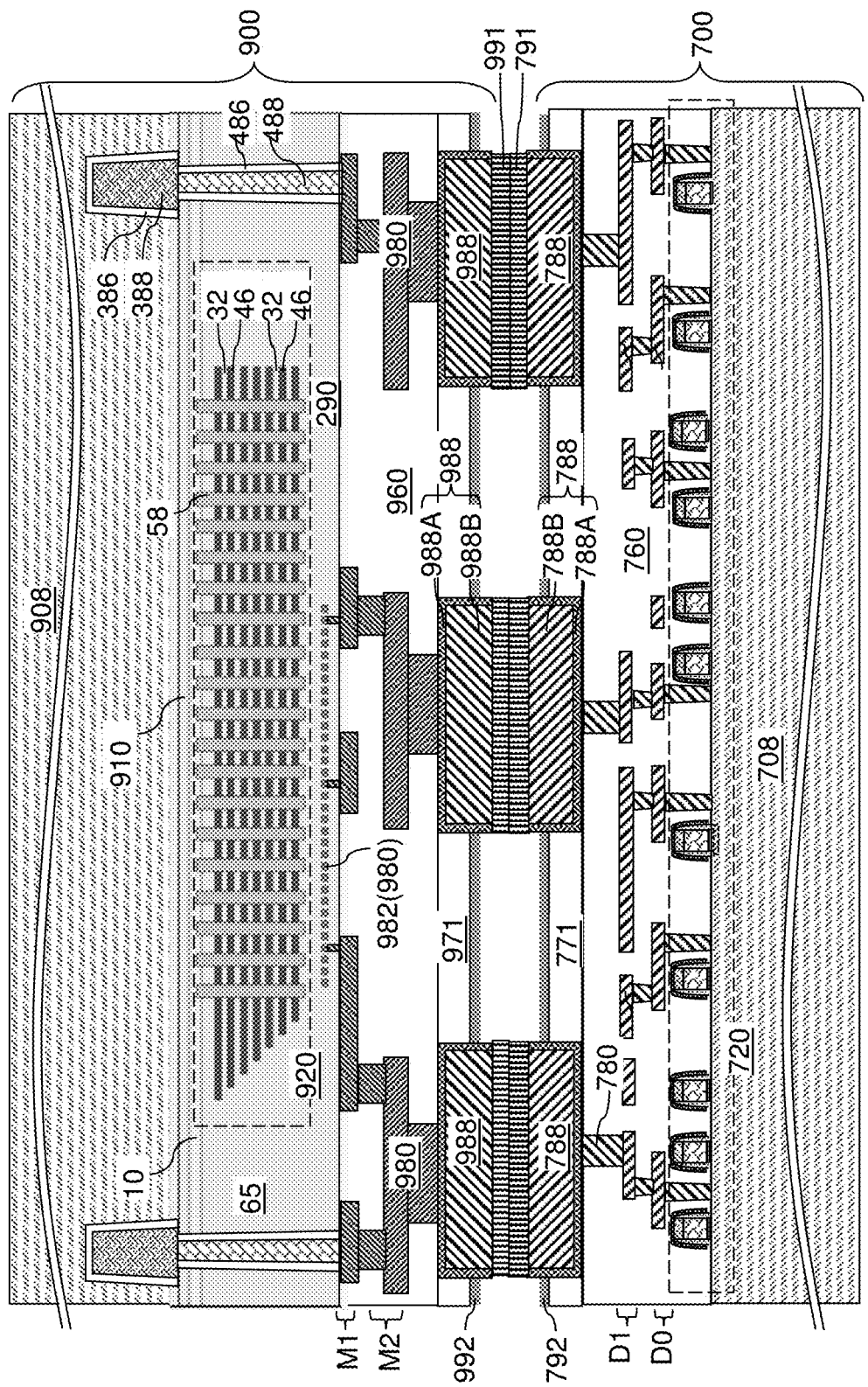
FIG. 7A is a schematic vertical cross-sectional view of a second exemplary structure including the first semiconductor die and the second semiconductor die after disposing the first semiconductor die on the second semiconductor die according to an embodiment of the present disclosure.

Referring to FIG. 7A, a second exemplary structure according to an embodiment of the present disclosure can be formed by disposing the first semiconductor die 900 of FIG. 1G over the second semiconductor die 700 of FIG. 2D. In other words, the processing steps of FIG. 1H and the processing steps of FIG. 2E are omitted before performing the die-to-die alignment step of FIG. 3A. In the second embodiment, SAM layers 791 and 991 are optional and may be omitted.

Figure 7B:
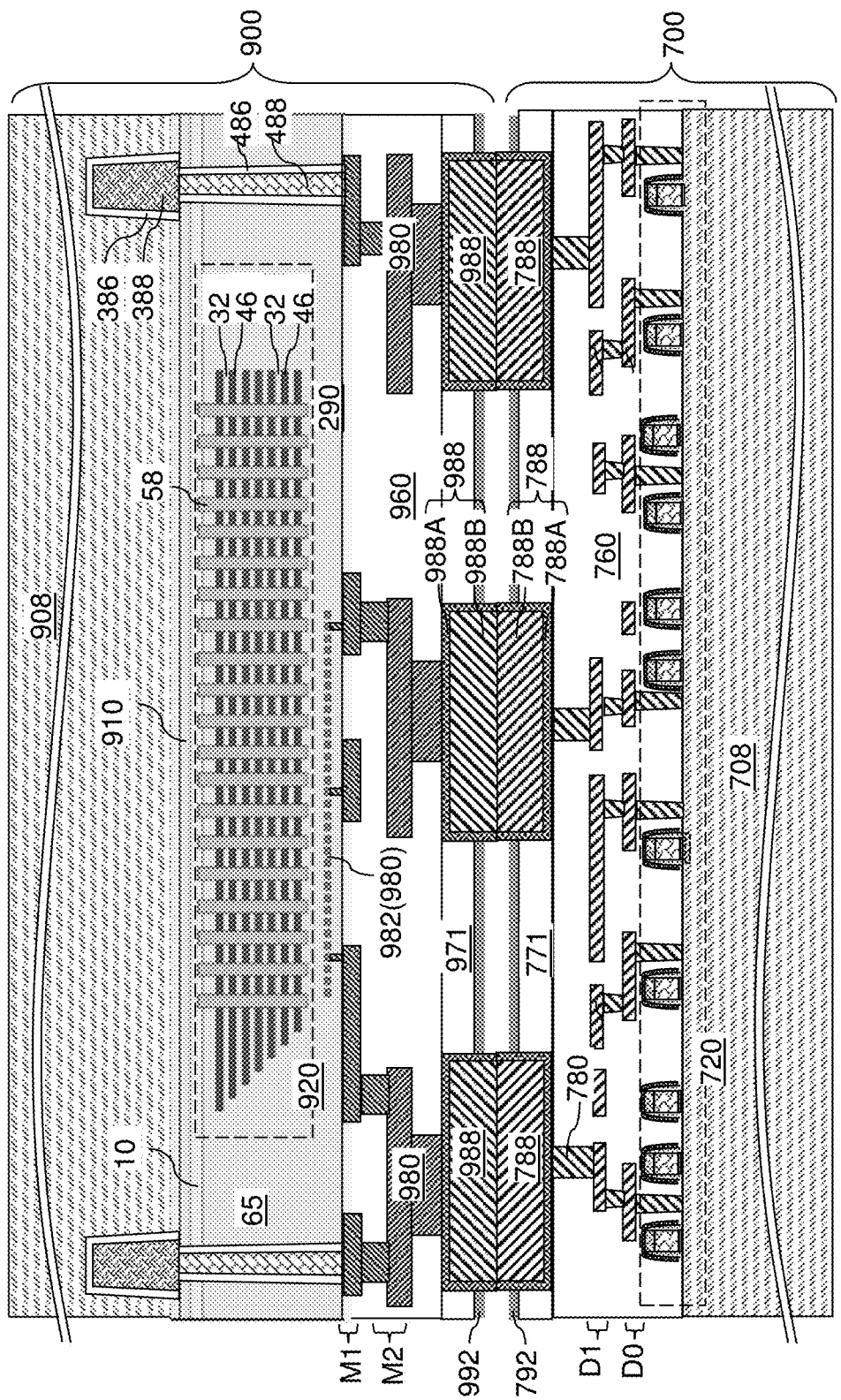
FIG. 7B is a schematic vertical cross-sectional view of the second exemplary structure after bonding the first semiconductor die to the second semiconductor die according to an embodiment of the present disclosure.

Referring to FIG. 7B, the processing steps of FIG. 4 can be performed to induce metal-to-metal bonding between the first bonding pads 988 and the second bonding pads 788. The first metal-containing precursor layer 992 may be spaced from the second metal-containing precursor layer 792 during the bonding process. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius. The molecules of the first SAM layer 991 and the second SAM layer 791 may decompose during the anneal process, and may be evaporated or may be incorporated into the first bonding pads 988 and the second bonding pads 788 as impurity atoms. For example, the first bonding pads 988 and the second bonding pads 788 may include carbon atoms at an interfacial portion thereof. Each bonded pair of a first bonding pad 988 and a second bonding pad 788 may be laterally surrounded by a continuously extending void.

Figure 7C:
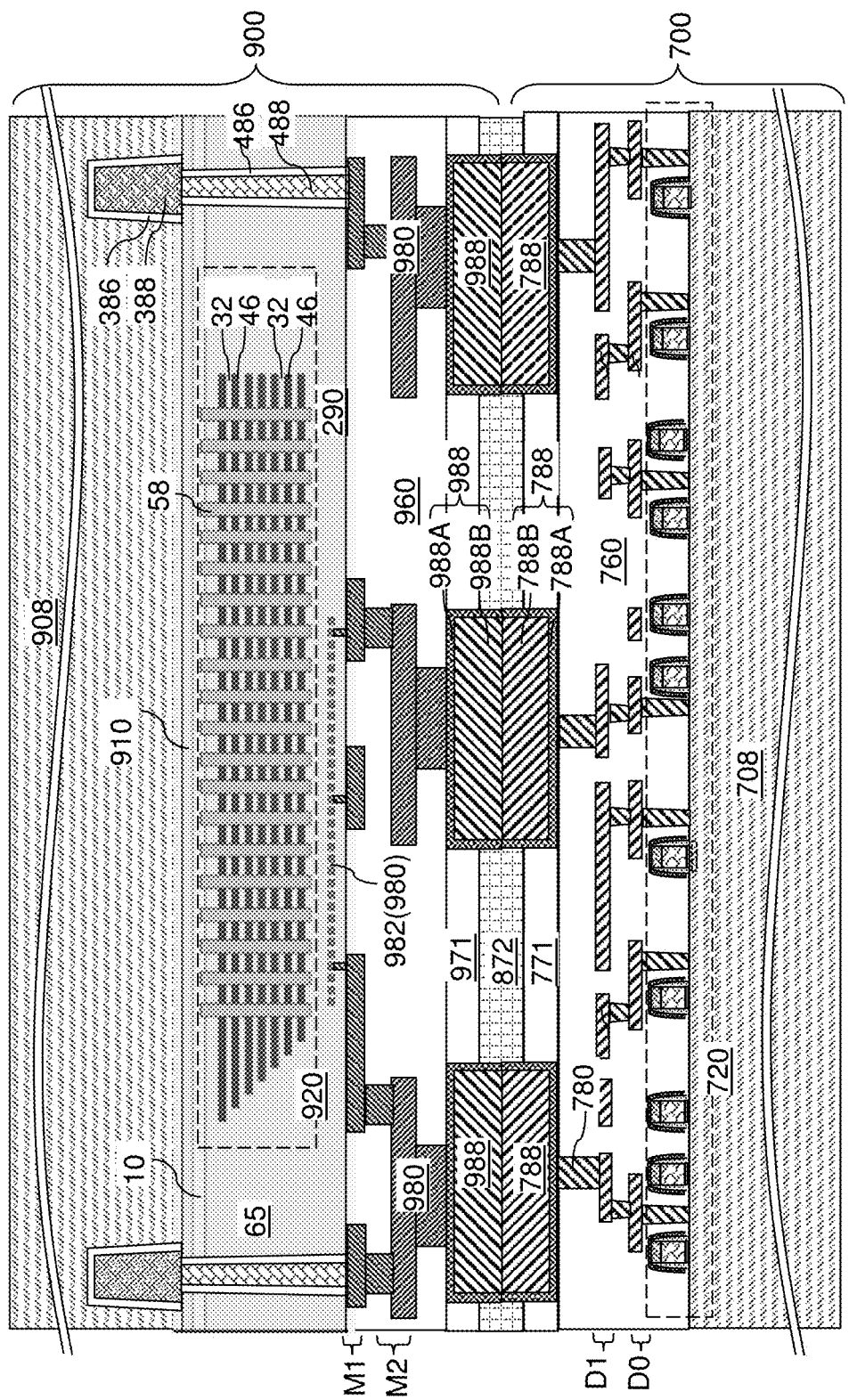
FIG. 7C is a schematic vertical cross-sectional view of the second exemplary structure after formation of a MOF dielectric layer according to an embodiment of the present disclosure.

Referring to FIG. 7C, a common metal-organic framework (MOF) dielectric layer 872 can be formed. For example, the bonded assembly of the first semiconductor die 900 and the second semiconductor die 700 can be placed in a vacuum-tight reaction chamber. An oxidation process can be performed to convert the material of the first metal-containing precursor layer 992 into a metal oxide material in case the first metal-containing precursor layer 992 includes an elemental metal, a metal nitride, or a metal carbide, and to convert the material of the second metal-containing precursor layer 792 into a metal oxide material in case the second metal-containing precursor layer 792 includes an elemental metal, a metal nitride, or a metal carbide. In case the first metal-containing precursor layer 992 and the second metal-containing precursor layer 792 include metal oxide materials, the oxidation process may be omitted.

The first metal-containing precursor layer 992 and the second metal-containing precursor layer 792 can be subsequently reacted with a vapor of at least one linking compound. The at least one linking compound may be a single linking compound if the first metal-containing precursor layer 992 and the second metal-containing precursor layer 792 comprise a same material or if both the first metal-containing precursor layer 992 and the second metal-containing precursor layer 792 form MOF materials upon exposure to an organic linker. Alternatively, the at least one linking compound may be two different linking compounds that includes a first linking compound that induces MOF material formation from the material of the first metal-containing precursor layer 992 and a second linking compound that induces MOF material formation from the material of the second metal-containing precursor layer 792.

The first metal-containing precursor layer 992 and the second metal-containing precursor layer 792 can be completely consumed during the optional oxidation process and subsequent conversion into the common MOF dielectric layer 872. Various MOF materials can be formed depending on the composition of the first metal-containing precursor layer 992 and the second metal-containing precursor layer 792. The common MOF dielectric layer 872 can include a first sub-layer that includes a first MOF material generated from the first metal-containing precursor layer 992 and a second MOF material generated from the second metal-containing precursor layer 792. The common MOF dielectric layer 872 can laterally surround the first bonding pads 988 and the second bonding pads 788.

In the case of the second exemplary structure illustrated in FIG. 7C, the first bonding pads 988 are bonded to the second bonding pads 788 prior to formation of the common MOF dielectric layer 872. In other words, the common MOF dielectric layer 872 is formed after bonding the first bonding pads 988 to the second bonding pads 788. The common MOF dielectric layer 872 laterally surrounds the second bonding pads 788 and contacts the second pad-level dielectric layer 771. The common MOF dielectric layer 872 can laterally surround, and can contact, each of the first bonding pads 988 and the second bonding pads 788 as a single MOF dielectric layer.

Figure 8A:
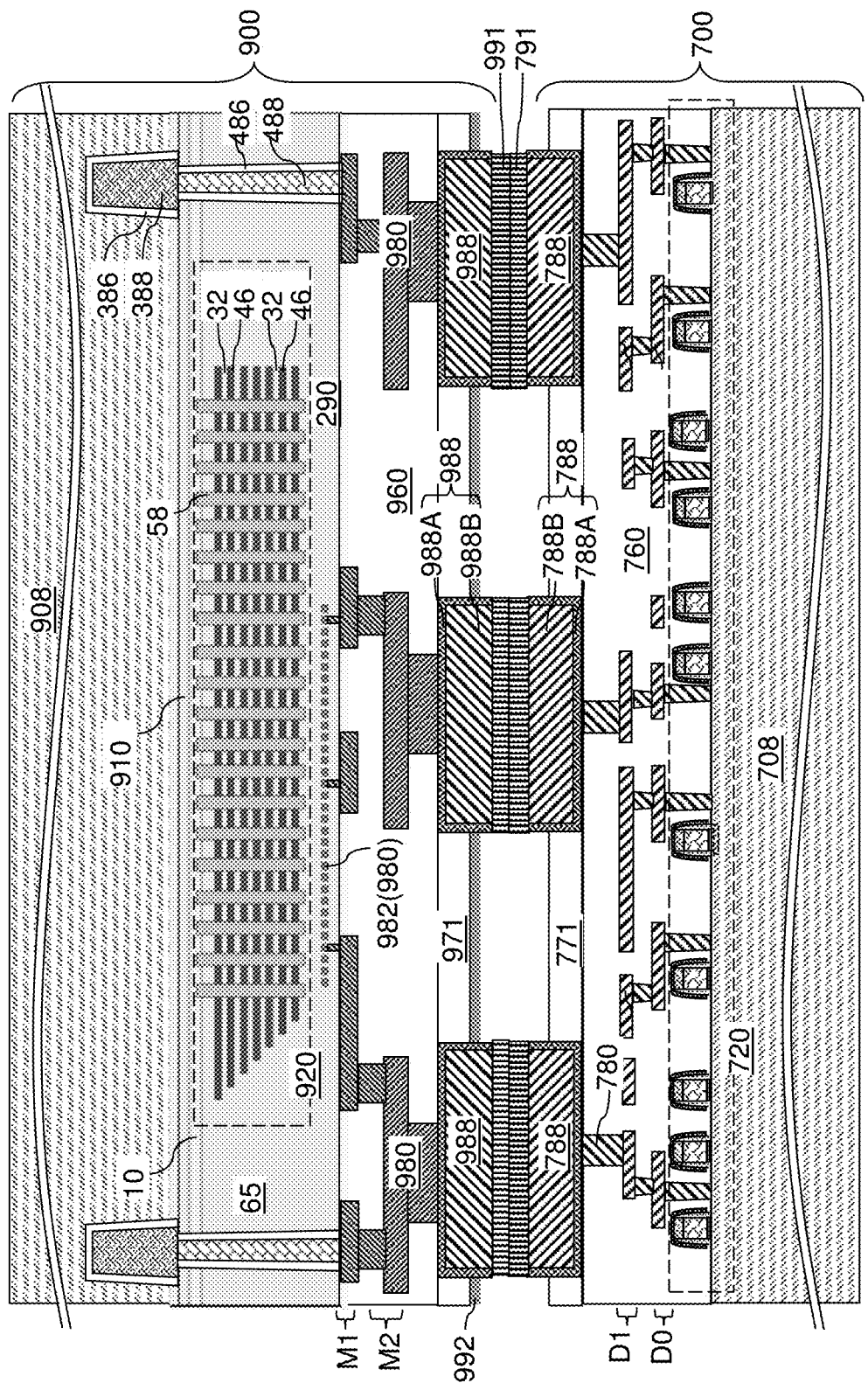
FIG. 8A is a schematic vertical cross-sectional view of a third exemplary structure after bonding the first semiconductor die to the second semiconductor die according to an embodiment of the present disclosure.

Referring to FIG. 8A, a third exemplary structure according to an embodiment of the present disclosure can be formed by disposing the first semiconductor die 900 of FIG. 1G over the second semiconductor die 700 of FIG. 2C. In other words, the processing steps of FIG. 1H and the processing steps of FIGS. 2D and 2E are omitted before performing the die-to-die alignment step of FIG. 3A. In this case, formation of the first and second SAM layers 991, 791 is optional. The thickness of the first metal-containing precursor layer 992 can be adjusted such that a MOF dielectric layer to be subsequently generated from the first metal-containing precursor layer 992 can fill the entire volume of the void between the first pad-level dielectric layer 971 and the second pad-level dielectric layer 771.

Figure 8B:
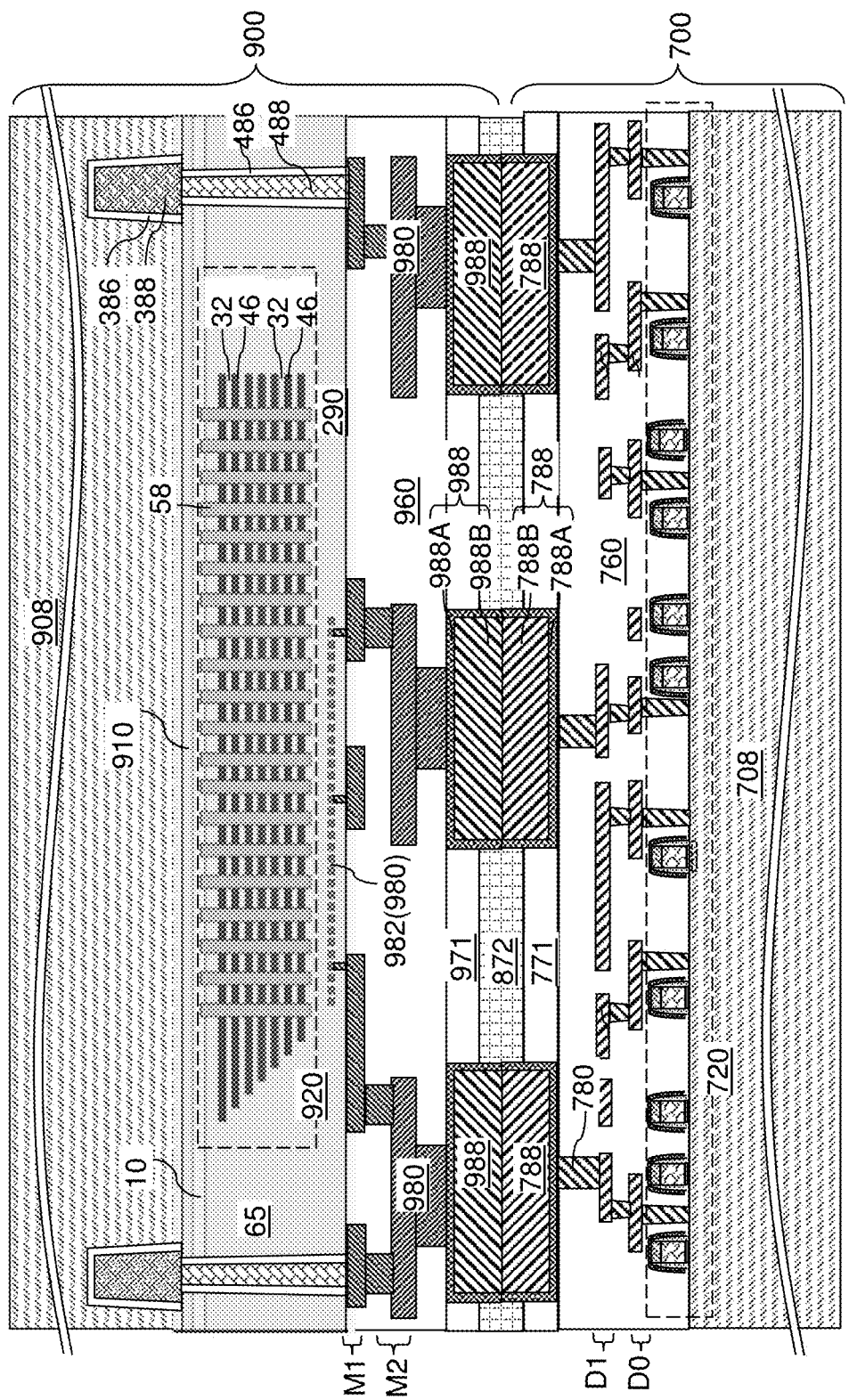
FIG. 8B is a schematic vertical cross-sectional view of the third exemplary structure after formation of a MOF dielectric layer according to an embodiment of the present disclosure.

Referring to FIG. 8B, the processing steps of FIG. 4 can be performed to induce metal-to-metal bonding between the first bonding pads 988 and the second bonding pads 788. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius. The molecules of the first SAM layer 991 and the second SAM layer 791 (if present) may decompose during the anneal process, and may be evaporated or may be incorporated into the first bonding pads 988 and the second bonding pads 788 as impurity atoms. For example, the first bonding pads 988 and the second bonding pads 788 may include carbon atoms at an interfacial portion thereof. Each bonded pair of a first bonding pad 988 and a second bonding pad 788 may be laterally surrounded by a continuously extending void.

A common MOF dielectric layer 872 can be formed by reacting the first metal-containing precursor layer 992 with a first vapor of a first linking compound. The common MOF dielectric layer 872 can laterally surround the first bonding pads 988 and the second bonding pads 788. For example, a bonded assembly of the first semiconductor die 900 and the second semiconductor die 700 can be placed in a vacuum-tight reaction chamber. An oxidation process can be performed to convert the material of the first metal-containing precursor layer 992 into a metal oxide material in case the first metal-containing precursor layer 992 includes an elemental metal, a metal nitride, or a metal carbide. In case the first metal-containing precursor layer 992 includes a metal oxide material, the oxidation process may be omitted.

The metal oxide material of the first metal-containing precursor layer 992, or the metal oxide material derived from the first metal-containing precursor layer 992, is exposed to the first vapor of the first linking compound (e.g., organic linking compound) that forms a metal-organic framework (MOF) material upon reaction. Any combination of a metallic material for the first metal-containing precursor layer 992 and the first vapor of the first linking compound that is known to form a MOF material may be employed. Generally, the molecular species for the first vapor of the first linking compound can be selected based on the metallic material in the first metal-containing precursor layer 992.

The common MOF dielectric layer 872 can be formed by reaction of the first metal-containing precursor layer 992 and the first vapor of the first linking compound. The first metal-containing precursor layer 992 can be completely consumed during the optional oxidation process and subsequent conversion into the common MOF dielectric layer 872. Various MOF materials can be formed depending on the composition of the first metal-containing precursor layer 992.

The common MOF dielectric layer 872 includes metal-organic framework (MOF) material portions that are formed by reacting the first metal-containing precursor layer 992 with the first vapor of the first linking compound. The MOF material portions comprise a metal-organic framework material including metal ions or clusters and organic ligands located between neighboring pairs of the metal ions or clusters. In one embodiment, the thickness of the first metal-containing precursor layer 992 can be selected such that the common MOF dielectric layer 872 fills the entirety of the void between the first pad-level dielectric layer 971 and the second pad-level dielectric layer 771. The top surface of the common MOF dielectric layer 872 can contact the second pad-level dielectric layer 771. The entirety of the common MOF dielectric layer 872 can have a same material composition throughout.

Figure 9A:
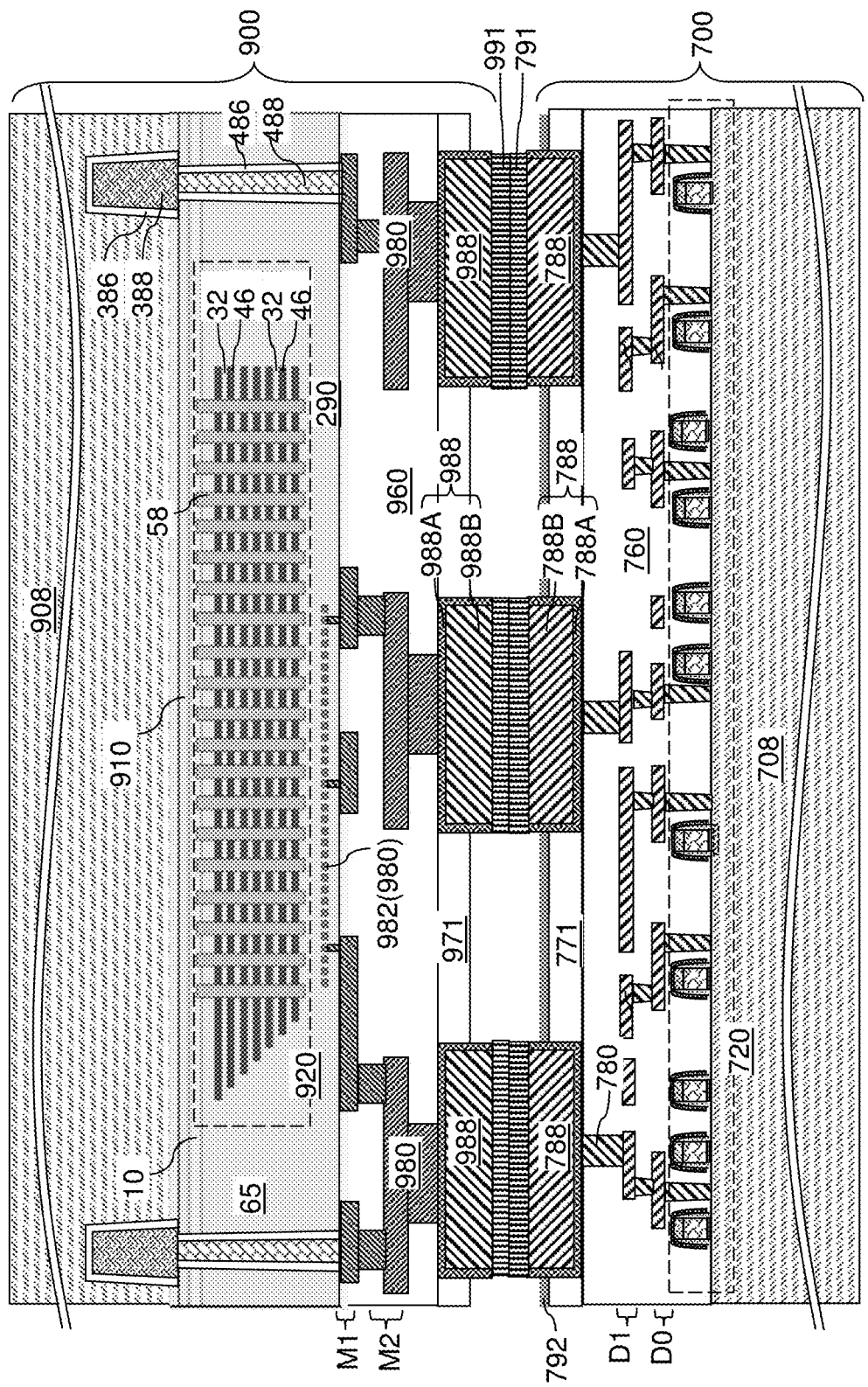
FIG. 9A is a schematic vertical cross-sectional view of a fourth exemplary structure after bonding the first semiconductor die to the second semiconductor die according to an embodiment of the present disclosure.

Referring to FIG. 9A, a fourth exemplary structure according to an embodiment of the present disclosure can be formed by disposing the first semiconductor die 900 of FIG. 1F over the second semiconductor die 700 of FIG. 2D. In other words, the processing steps of FIGS. 1G and 1H and the processing steps of FIG. 2E are omitted before performing the die-to-die alignment step of FIG. 3A. In this case, formation of the first and second SAM layers 991, 771 is optional. The thickness of the second metal-containing precursor layer 792 can be adjusted such that a MOF dielectric layer to be subsequently generated from the second metal-containing precursor layer 792 can fill the entire volume of the void between the first pad-level dielectric layer 971 and the second pad-level dielectric layer 771.

Figure 9B:
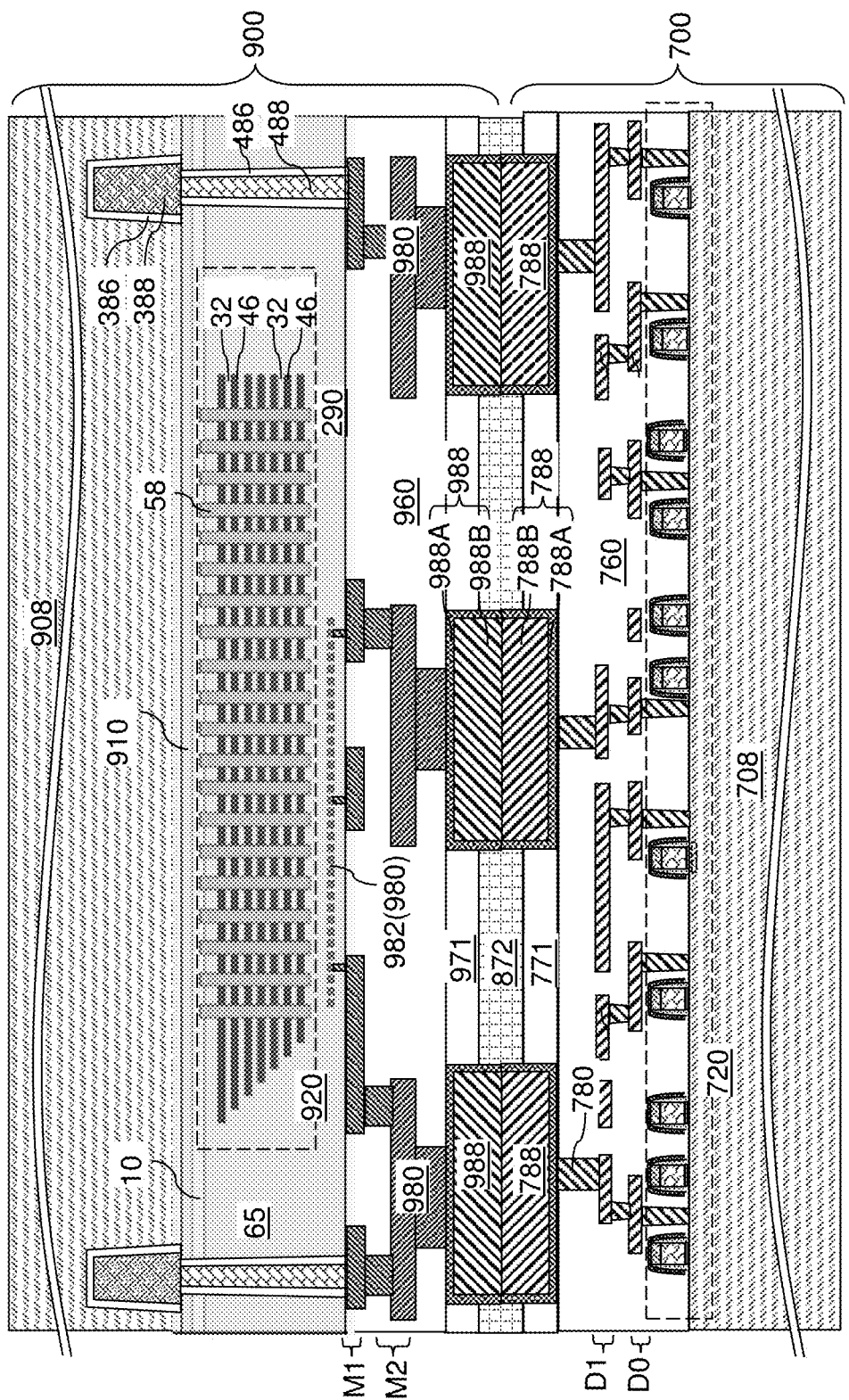
FIG. 9B is a schematic vertical cross-sectional view of the fourth exemplary structure after formation of a MOF dielectric layer according to an embodiment of the present disclosure.

Referring to FIG. 9B, the processing steps of FIG. 4 can be performed to induce metal-to-metal bonding between the first bonding pads 988 and the second bonding pads 788. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius. The molecules of the first SAM layer 991 (if present) and the second SAM layer 791 (if present) may decompose during the anneal process, and may be evaporated or may be incorporated into the first bonding pads 988 and the second bonding pads 788 as impurity atoms. For example, the first bonding pads 988 and the second bonding pads 788 may include carbon atoms at an interfacial portion thereof. Each bonded pair of a first bonding pad 988 and a second bonding pad 788 may be laterally surrounded by a continuously extending void.

A common MOF dielectric layer 872 can be formed by reacting the second metal-containing precursor layer 792 with a vapor of a linking compound. The common MOF dielectric layer 872 can laterally surround the first bonding pads 988 and the second bonding pads 788. For example, the first semiconductor die 900 can be placed in a vacuum-tight reaction chamber. An oxidation process can be performed to convert the material of the second metal-containing precursor layer 792 into a metal oxide material in case the second metal-containing precursor layer 792 includes an elemental metal, a metal nitride, or a metal carbide. In case the second metal-containing precursor layer 792 includes a metal oxide material, the oxidation process may be omitted.

The metal oxide material of the second metal-containing precursor layer 792, or the metal oxide material derived from the second metal-containing precursor layer 792, is exposed to the first vapor of the first linking compound (e.g., organic linking compound) that forms a metal-organic framework (MOF) material upon reaction. Any combination of a metallic material for the second metal-containing precursor layer 792 and the vapor of the linking compound that is known to form a MOF material may be employed. Generally, the molecular species for the first vapor of the first linking compound can be selected based on the metallic material in the second metal-containing precursor layer 792.

The common MOF dielectric layer 872 can be formed by reaction of the second metal-containing precursor layer 792 and the vapor of the linking compound. The second metal-containing precursor layer 792 can be completely consumed during the optional oxidation process and subsequent conversion into the common MOF dielectric layer 872. Various MOF materials can be formed depending on the composition of the second metal-containing precursor layer 792.

The common MOF dielectric layer 872 includes metal-organic framework (MOF) material portions that are formed by reacting the second metal-containing precursor layer 792 with the vapor of the linking compound. The MOF material portions comprise a metal-organic framework material including metal ions or clusters and organic ligands located between neighboring pairs of the metal ions or clusters. In one embodiment, the thickness of the second metal-containing precursor layer 792 can be selected such that the common MOF dielectric layer 872 fills the entirety of the void between the first pad-level dielectric layer 971 and the second pad-level dielectric layer 771. The top surface of the common MOF dielectric layer 872 can contact the first pad-level dielectric layer 971. The entirety of the common MOF dielectric layer 872 can have a same material composition throughout.

Referring to all drawings and according to various embodiments, a bonded assembly is provided, which comprises: a first semiconductor die 900 comprising a first substrate 908, first semiconductor devices 920, and first bonding pads 988 that are electrically connected to a respective node of the first semiconductor devices 920; a second semiconductor die 700 comprising a second substrate 708, second semiconductor devices 720, and second bonding pads 788 that are electrically connected to a respective node of the second semiconductor devices 720 and bonded to a respective one of the first bonding pads 988; and at least one metal-organic framework (MOF) dielectric layer {(972, 772) or 872} that laterally surrounds at least one of the first bonding pads 988 and the second bonding pads 788.

In one embodiment, the first semiconductor die 900 comprises a first pad-level dielectric layer 971 laterally surrounding and contacting proximal portions of sidewalls of the first bonding pads 988 that are proximal to the first substrate 908; and the at least one MOF dielectric layer {(972, 772), or 872} laterally surrounds and contacts distal portions of the first bonding pads 988 that are distal from the first substrate 908.

In one embodiment, the first pad-level dielectric layer 971 comprises a material selected from undoped silicate glass, a doped silicate glass, organosilicate glass, silicon nitride, or a dielectric metal oxide.

In one embodiment, the second semiconductor die 700 comprises a second pad-level dielectric layer 771 laterally surrounding and contacting proximal portions of sidewalls of the second bonding pads 788 that are proximal to the second substrate 708; and the at least one MOF dielectric layer {(972, 772) or 872} laterally surrounds and contacts distal portions of the second bonding pads 788 that are distal from the second substrate 708.

In one embodiment, the at least one MOF dielectric layer (972, 772) comprises: a first MOF dielectric layer 972 laterally surrounding and contacting the first bonding pads 988; and a second MOF dielectric layer 772 laterally surrounding and contacting the second bonding pads 788. In one embodiment, a horizontal interface between the first MOF dielectric layer 972 and the second MOF dielectric layer 772 is located within a same horizontal plane as interfaces between mating pairs of the first bonding pads 988 and the second bonding pads 788.

In one embodiment, the at least one MOF dielectric layer 872 consists of a common single MOF dielectric layer that laterally surrounds and contacts each of the first bonding pads 988 and the second bonding pads 788.

In one embodiment, each of the first bonding pads 988 comprises: a metallic liner 988A contacting the at least one MOF layer {(972, 772) or 872}; and a metallic fill material portion 988B that is laterally surrounded by the metallic liner 988A and laterally spaced from the at least one MOF layer {(972, 772) or 872}. In one embodiment, the metallic liner 908A comprises a metallic nitride material; and metallic fill material portion 988B comprises copper.

In one embodiment, the at least one MOF layer {(972, 772) or 872} comprises at least one metallic element that is not present in the first bonding pads 988 and the second bonding pads 788.

In one embodiment, one of the first semiconductor die 900 and the second semiconductor die 700 comprises a memory die including a three-dimensional array of memory elements; and another of the first semiconductor die 900 and the second semiconductor die 700 comprise a logic die including a logic circuit configured to control operation of the three-dimensional array of memory elements.

While the present disclosure is described employing an embodiment in which the first semiconductor die 900 comprises a memory die and the second semiconductor die 700 comprises a logic die, the embodiments of the present disclosure can be practiced in any pair of semiconductor dies including any type of semiconductor devices therein. All such variations are expressly contemplated herein.

In prior art bonded assemblies, voids tend to occur at the bonding interfaces due to the height difference between the bonding pads and the surrounding pad-level dielectric layer. If the bonding pads protrude above the pad-level dielectric layer, then voids tend to occur between the opposing pad-level dielectric layers of bonded die. If the bonding pads are recessed below the pad-level dielectric layer, then the voids tend to occur at the edges of the bonding pads. The structures and methods of the embodiments of the present disclosure can be employed to provide a bonded assembly of a first semiconductor die 900 and a second semiconductor die 700 including bonded pairs of bonding pads (988, 788) that are laterally surrounded by at least one MOF bonding dielectric layer {(972, 772) or 872}. The at least one MOF bonding dielectric layer has a controlled thickness which may reduce or eliminate voids at the interface between the two die by reducing or avoiding protruding or recessed bonding pads. Furthermore, the at least one MOF bonding dielectric reduces or eliminates copper diffusion from the bonding pads into the bonding dielectric.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly comprising:
   a first semiconductor die comprising a first substrate, first semiconductor devices, and first bonding pads that are electrically connected to a respective node of the first semiconductor devices;
   a second semiconductor die comprising a second substrate, second semiconductor devices, and second bonding pads that are electrically connected to a respective node of the second semiconductor devices and bonded to a respective one of the first bonding pads; and at least one metal-organic framework (MOF) dielectric layer that laterally surrounds at least one of the first bonding pads and the second bonding pads.

2. The bonded assembly of claim 1, wherein:
the first semiconductor die comprises a first pad-level dielectric layer laterally surrounding and contacting proximal portions of sidewalls of the first bonding pads that are proximal to the first substrate; and
the at least one MOF dielectric layer laterally surrounds and contacts distal portions of the first bonding pads that are distal from the first substrate.

3. The bonded assembly of claim 2, wherein the first pad-level dielectric layer comprises a material selected from undoped silicate glass, a doped silicate glass, organosilicate glass, silicon nitride, or a dielectric metal oxide.

4. The bonded assembly of claim 2, wherein:
the second semiconductor die comprises a second pad-level dielectric layer laterally surrounding and contacting proximal portions of sidewalls of the second bonding pads that are proximal to the second substrate; and
the at least one MOF dielectric layer laterally surrounds and contacts distal portions of the second bonding pads that are distal from the second substrate.

5. The bonded assembly of claim 4, wherein the at least one MOF dielectric layer comprises:
a first MOF dielectric layer laterally surrounding and contacting the first bonding pads; and
a second MOF dielectric layer laterally surrounding and contacting the second bonding pads.

6. The bonded assembly of claim 5, wherein a horizontal interface between the first MOF dielectric layer and the second MOF dielectric layer is located within a same horizontal plane as interfaces between mating pairs of the first bonding pads and the second bonding pads.

7. The bonded assembly of claim 4, wherein the at least one MOF dielectric layer consists of a single MOF dielectric layer that laterally surrounds and contacts each of the first bonding pads and the second bonding pads.

8. The bonded assembly of claim 1, wherein each of the first bonding pads comprises:
a metallic liner contacting the at least one MOF layer; and
a metallic fill material portion that is laterally surrounded by the metallic liner and laterally spaced from the at least one MOF layer.

9. The bonded assembly of claim 8, wherein:
the metallic liner comprises a metallic nitride material; and
the metallic fill material portion comprises copper.

10. The bonded assembly of claim 1, wherein the at least one MOF layer comprises at least one metallic element that is not present in the first bonding pads and the second bonding pads.

11. The bonded assembly of claim 1, wherein:
one of the first semiconductor die and the second semiconductor die comprises a memory die including a three-dimensional array of memory elements; and
another of the first semiconductor die and the second semiconductor die comprise a logic die including a logic circuit configured to control operation of the three-dimensional array of memory elements.

12. The bonded assembly of claim 1, wherein the at least one MOF dielectric layer comprises MIL-125.

13. The bonded assembly of claim 1, wherein the at least one MOF dielectric layer comprises TUDMOF-1.

14. The bonded assembly of claim 1, wherein the at least one MOF dielectric layer comprises MOF-5.

15. The bonded assembly of claim 1, wherein the at least one MOF dielectric layer has a dielectric constant in a range from 1.7 to 2.6.

16. The bonded assembly of claim 1, wherein the at least one MOF dielectric layer comprises a metal-organic framework of a metal selected from titanium, molybdenum, copper, cobalt, zirconium, zinc, manganese, and ruthenium.

17. The bonded assembly of claim 1, wherein the at least one MOF dielectric layer contacts sidewalls of the first bonding pads and the second bonding pads.

18. The bonded assembly of claim 2, wherein:
a horizontal surface of the first pad-level dielectric layer is in contact with a horizontal surface of the at least one MOF dielectric layer; and
each of the first bonding pads is in contact with a respective edge of an interface between the first pad-level dielectric layer and the at least one MOF dielectric layer.

* * * * *